United States Patent
Iwami

(10) Patent No.: US 10,359,896 B2
(45) Date of Patent: Jul. 23, 2019

(54) CONDUCTIVE FILM AND DISPLAY DEVICE INCLUDING THE SAME

(71) Applicant: FUJIFILM Corporation, Tokyo (JP)

(72) Inventor: Kazuchika Iwami, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 15/952,242

(22) Filed: Apr. 13, 2018

(65) Prior Publication Data

US 2018/0232080 A1 Aug. 16, 2018

Related U.S. Application Data

(63) Continuation of application No. PCT/JP2016/079793, filed on Oct. 6, 2016.

(30) Foreign Application Priority Data

Oct. 16, 2015 (JP) ................................ 2015-204748

(51) Int. Cl.
  *G06F 3/044* (2006.01)
  *H05K 9/00* (2006.01)
  *G02F 1/1333* (2006.01)

(52) U.S. Cl.
  CPC .......... *G06F 3/044* (2013.01); *G02F 1/13338* (2013.01); *H05K 9/0096* (2013.01);
  (Continued)

(58) Field of Classification Search
  CPC combination set(s) only.
  See application file for complete search history.

(56) References Cited

U.S. PATENT DOCUMENTS 9,832,862 B2 * 11/2017 Iwami .................. H05K 1/0274
2013/0255998 A1 10/2013 Iwami et al.
(Continued)

FOREIGN PATENT DOCUMENTS

JP 2014519129 8/2014
JP 2014523599 9/2014
(Continued)

OTHER PUBLICATIONS

"International Search Report (Form PCT/ISA/210) of PCT/JP2016/079793", dated Nov. 22, 2016, with English translation thereof, pp. 1-5.
(Continued)

*Primary Examiner* — Peter D McLoone
(74) *Attorney, Agent, or Firm* — JCIPRNET

(57) ABSTRACT

With respect to a conductive film according to the present invention, in a case where in one or more metal thin wires forming a irregular wiring pattern, one continuous line segment which extends in the longitudinal direction of the subpixels of the display unit and which can be regarded as one traverse one or more subpixels in the longitudinal direction, in a case where a total length of one or more traverse subpixels in which the one line segment is traversed in the longitudinal direction is set as a length L μm and a coverage in which one line segment covers one or more traverse subpixels is set as C %, the length L and the coverage C of one line segment of the irregular wiring pattern that is overlapped with a pixel arrangement pattern of the display unit are included in a region below a line represented by equations below, in a case where $0<x\leq 168$, $y=6.7$, in a case where $168<x\leq 252$, $y=-0.00595x+7.7$, in a case where $252<x\leq 378$, $y=-0.00476x+7.4$, (Continued)

in a case where $378<x\leq504$, $y=-0.02143x+13.7$, and in a case where $504<x\leq756$, $y=2.9$.

20 Claims, 18 Drawing Sheets

(52) U.S. Cl.
CPC .............. *G06F 2203/04103* (2013.01); *G06F 2203/04112* (2013.01)

(56) References Cited

U.S. PATENT DOCUMENTS

| | | | |
|---|---|---|---|
| 2014/0098307 A1* | 4/2014 | Iwami | B32B 15/02 349/12 |
| 2014/0198264 A1 | 7/2014 | Gao et al. | |
| 2015/0015979 A1* | 1/2015 | Iwami | H05K 9/0096 359/893 |
| 2015/0015980 A1* | 1/2015 | Iwami | H05K 9/0096 359/893 |
| 2015/0220107 A1 | 8/2015 | Hwang et al. | |
| 2015/0286323 A1* | 10/2015 | Iwami | G06F 3/041 345/174 |
| 2015/0342034 A1 | 11/2015 | Iwami | |
| 2016/0092012 A1* | 3/2016 | Yamaguchi | G06F 1/16 345/173 |
| 2017/0052643 A1* | 2/2017 | Iwami | G06F 3/044 |

FOREIGN PATENT DOCUMENTS

| | | |
|---|---|---|
| JP | 2015108896 | 6/2015 |
| WO | 2014123009 | 8/2014 |
| WO | 2015072253 | 5/2015 |
| WO | 2015087863 | 6/2015 |

OTHER PUBLICATIONS

"Written Opinion of the International Searching Authority of PCT/JP2016/079793" with English translation thereof, dated Nov. 22, 2016, p. 1-8.

"Search Report of Europe Counterpart Application", dated Sep. 26, 2018, p. 1-7.

* cited by examiner

No. 9

326dpi

No. 10

326dpi

No. 11

384dpi

No. 13

384dpi v2

No. 12

384dpi

No. 14

384dpi v2

No. 15

440dpi

No. 16

440dpi

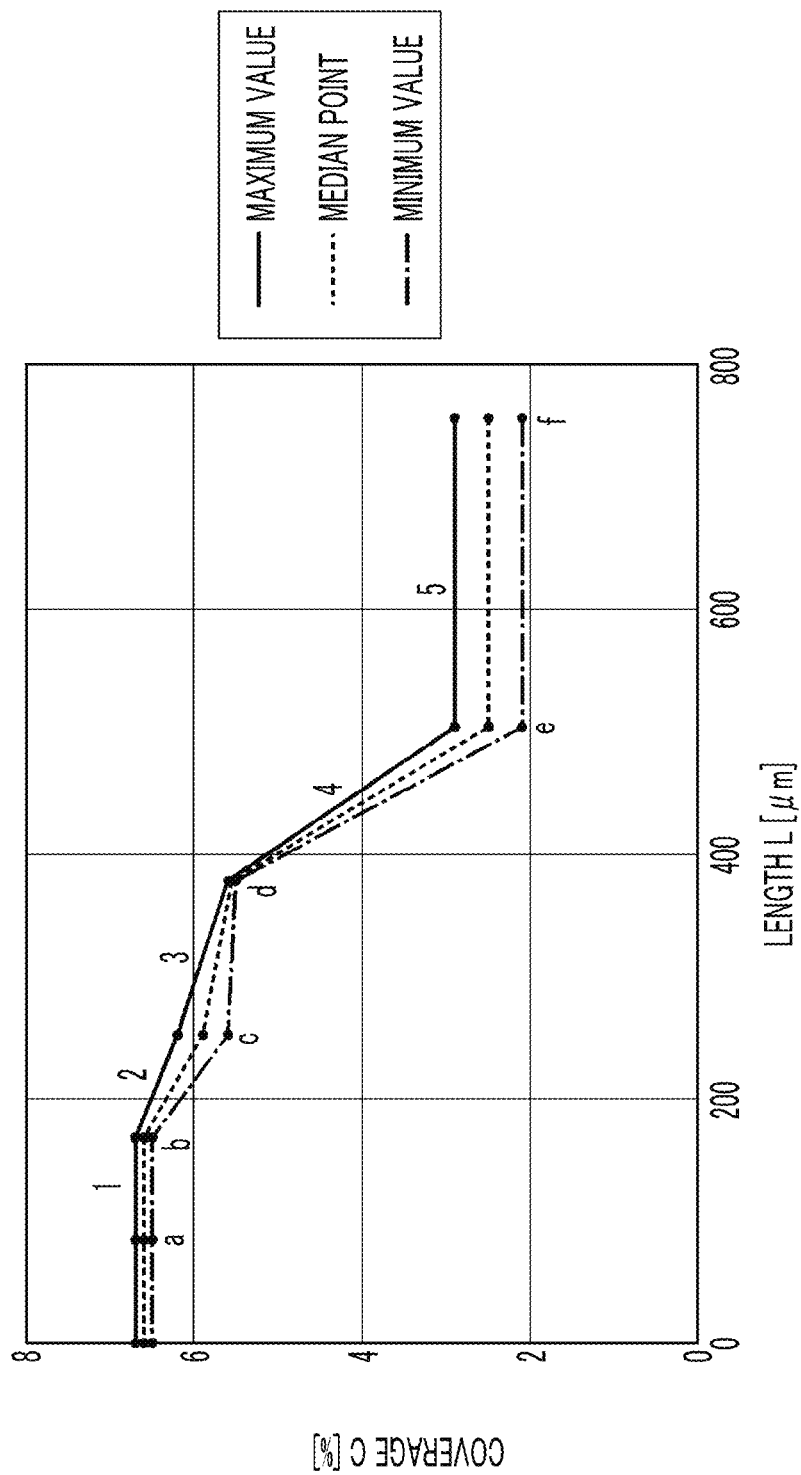

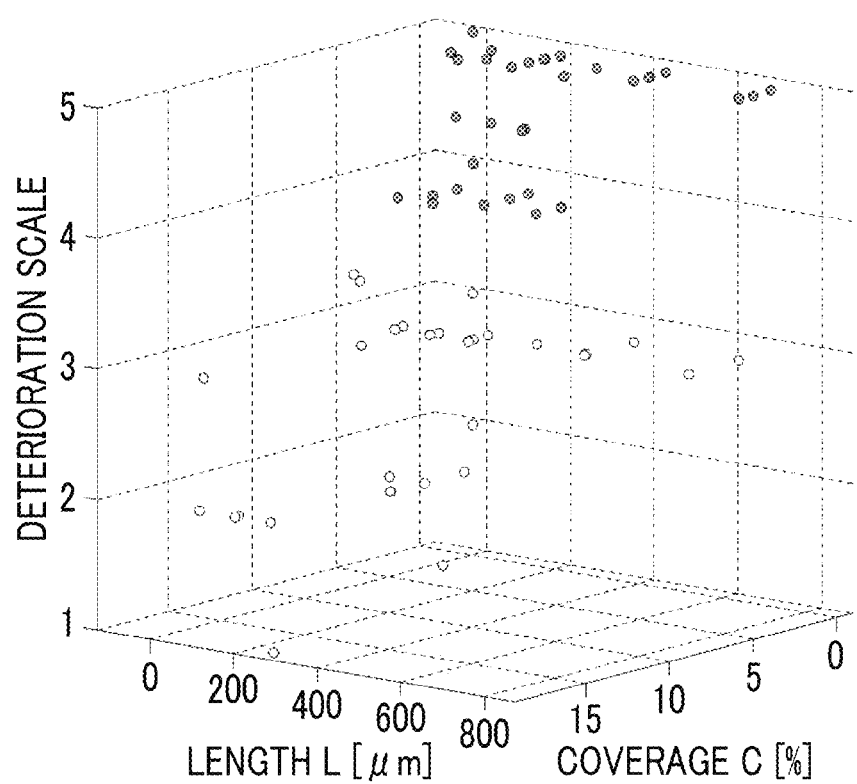

CONDUCTIVE FILM AND DISPLAY DEVICE INCLUDING THE SAME

CROSS-REFERENCE TO RELATED APPLICATIONS

This application is a Continuation of PCT International Application No. PCT/JP2016/079793 filed on Oct. 6, 2016, which claims priority under 35 U.S.C. § 119(a) to Japanese Patent Application No. 2015-204748 filed on Oct. 16, 2015. The above application is hereby expressly incorporated by reference, in its entirety, into the present application.

BACKGROUND OF THE INVENTION

1. Field of the Invention

The present invention relates to a conductive film and a display device including the same, and specifically, a conductive film in which a noise due to the interference with a display device is suppressed and a mesh-like wiring pattern having excellent visibility is provided, and a display device.

2. Description of the Related Art

Examples of a conductive film provided on a display unit of a display device (hereinafter, referred to as a display) include a conductive film for a touch panel having a conductive film formed of a metal thin wire having a mesh-like wiring pattern (hereinafter, referred to as a mesh pattern) or a conductive film for an electromagnetic wave shield.

In this mesh pattern, recognition of moire becomes problematic due to the interference with the pixel arrangement pattern (for example, may be referred to as an arrangement pattern of an RGB color filter or a black matrix (hereinafter, also referred to as BM) pattern which is an inverted pattern thereof) of the display, and thus a plurality of random mesh patterns in which moire is not recognized or is hardly recognized are suggested (for example, see JP2014-519129A).

For example, JP2014-519129A discloses a metal mesh conductive layer which is made of metal and which includes a transparent electrode region having a random irregular mesh made of an irregular polygonal shape and discloses that the generation of moire is prevented even though a transparent electrode region made of an irregular mesh is overlapped on the surface of the liquid crystal display.

In this manner, it is known that the random mesh pattern represented by the Voronoi polygon and the Delaunay triangle have an effect of restraining moire generated in a case of overlapping with the display and improving visibility without depending on the display resolution.

SUMMARY OF THE INVENTION

In JP2014-519129A, in order to improve the visibility of the transparent electrode region, it is suggested that a metal electrode is formed with a random irregular mesh so as to have a random mesh pattern.

However, by the overlapping with the display, the random mesh pattern generates a variety of noises, and thus there is a problem in that it is difficult to improve the visibility thereof in a single pattern.

In order to cause the random mesh pattern to function as a touch panel by using the random irregular mesh disclosed in JP2014-519129A as a start, a process of forming a sensor film based on electronic data of a random mesh pattern is required. For example, random pattern information formed by computer aided design (CAD) or ILLUSTRATOR (registered trademark) is read, and a sensor film is formed by exposure, lithography, and printing processes. In a case where a random mesh pattern is provided as vector data, as the size of the display to be applied increases, the capacity of the electronic data increases, and thus handling of the data becomes difficult in some cases. Therefore, there is an effort of creating a random mesh pattern in a small region and repeating the pattern so as to suppress the increase of data capacity.

However, in this case, it is known that there is a problem in that visibility is deteriorated due to the repetitive structure. As an example of visibility deterioration due to the repetition of a small piece of the random mesh pattern, an example in which the repeating shape is recognized is illustrated in FIG. 25. For example, in a case where a display is formed with a small piece of the random pattern, unless a certain constraint condition is not provided, there is a problem in that the repeating shape as illustrated in FIG. 25 is conspicuous and is easily recognized. Here, FIG. 25 is a captured image of the random mesh pattern and repetitive local visibility deteriorated portions are surrounded by circles. In the locally visibility deteriorated portions surrounded by circles, the connection of black dots indicates the deteriorated portions and the other portions indicate even noises.

Therefore, in order to prevent visibility deterioration due to repetition of the small piece of the random mesh pattern, it is required to provide constraints during the forming of electronic data of the random mesh pattern. That is, it is important to define a combination of a display and a random pattern for improving visibility.

An object of the present invention is to provide a conductive film having a random (irregular) mesh-like wiring pattern (mesh pattern) capable of suppressing generation of a noise recognized in combination with a display unit (display) and improving visibility and a display device including the same.

Particularly, an object of the present invention is to provide a conductive film having a random mesh pattern that may have combination with a mesh pattern and a display that can provide the best image quality in which the moire and also the noise are not recognized or hardly recognized in the design of a random mesh pattern in a case where the openings of the red (R), green (G), and blue (B) subpixels of the display have different frequencies and intensities and a display device including the same.

In order to achieve the above objects, a conductive film relating to a first embodiment is a conductive film provided on a display unit of a display device and comprises a transparent base body; and a conductive portion formed of a plurality of metal thin wires and provided on at least one surface of the transparent base body, the conductive portion has an irregular wiring pattern which has a mesh shape formed of a plurality of metal thin wires and has a plurality of opening portions having a different opening shape, the display unit has a pixel arrangement pattern in which pixels including a plurality of subpixels that emit light in a plurality of colors of at least three colors are arranged, wherein the conductive film is provided on the display unit such that the irregular wiring pattern and the pixel arrangement pattern of the display unit are overlapped with each other, and in a case where one or more metal thin wires forming the irregular wiring pattern is formed of one continuous line segment which extends in the longitudinal direction of the subpixels of the display unit and which can be regarded as one and the one line segment longitudinally traverses one or more subpixels that are arranged in the longitudinal direction, in a case where a total length of one or more traverse subpixels which the one line segment traverses in the longitudinal direction is set as a length L μm of the one line segment, a total area of one or more traverse subpixels is set as S, and a total area occupied by the one line segment in the one or more traverse subpixels is set as a line width area $S_L$, and a coverage C % is represented by Equation (1), $$C=100\times S_L/S \qquad (1),$$

in an xy two-dimensional coordinates in which the length L of the one line segment is set as a lateral axis which is an x coordinate and a coverage C is a vertical axis which is a y coordinate, the irregular wiring pattern is formed of the one or more metal thin wires that is formed of the one line segment included in a region below a line represented by Equation (2).

In a case where $0<x\leq 168$, $y=6.7$, in a case where $168<x\leq 252$, $y=-0.00595x+7.7$, in a case where $252<x\leq 378$, $y=-0.00476x+7.4$, in a case where $378<x\leq 504$ $y=-0.02143x+13.7$, and in a case where $504<x\leq 756$ $y=2.9$ \qquad (2)

That is, the irregular wiring pattern is formed of a region below a line obtained by connecting six coordinates (84, 6.7), (168, 6.7), (252, 6.2), (378, 5.6), (504, 2.9), and (756, 2.9) in the xy two-dimensional coordinates and one or more metal thin wires formed of one line segment included in a region in which a length L of one line segment is 84 mm or less and a coverage C is 6.7% or less.

In order to achieve the above objects, a display device relating to a second aspect of the present invention comprises a display unit in which a pixel including a plurality of subpixels that emit light in a plurality of colors different from each other is arranged in a pixel arrangement pattern in a manner of repeating in one direction and a direction perpendicular to the one direction and the conductive film according to the first aspect provided on the display unit.

As described above, according to the present invention, it is possible to provide a conductive film having a random (irregular) mesh-like wiring pattern (mesh pattern) capable of suppressing generation of a noise recognized in combination with a display unit (display) and improving visibility and a display device including the same.

Particularly, it is possible to provide a conductive film having a random mesh pattern that may have combination with a mesh pattern and a display that can provide the best image quality in which the moire and also the noise are not visually recognized or hardly visually recognized in the design of a random mesh pattern in a case where the openings of the red (R), green (G), and blue (B) subpixels of the display have different frequencies and intensities and a display device including the same.

BRIEF DESCRIPTION OF THE DRAWINGS

FIG. 19 is a graph presenting a line of a total length L and a coverage C of one line segment, the line which divides a region in which a noise is not recognized in a case where one continuous line segment of a metal thin wire forming a random mesh-like wiring pattern of the conductive film according to the present invention traverses one or more subpixels of a pixel arrangement pattern of a display unit.

FIG. 22 is a three-dimensional view obtained by plotting a result of a simulation experiment in the present invention with a length L, a coverage C, and a deterioration scale on three-dimensional coordinates.

DESCRIPTION OF THE PREFERRED EMBODIMENTS

Figure 1:
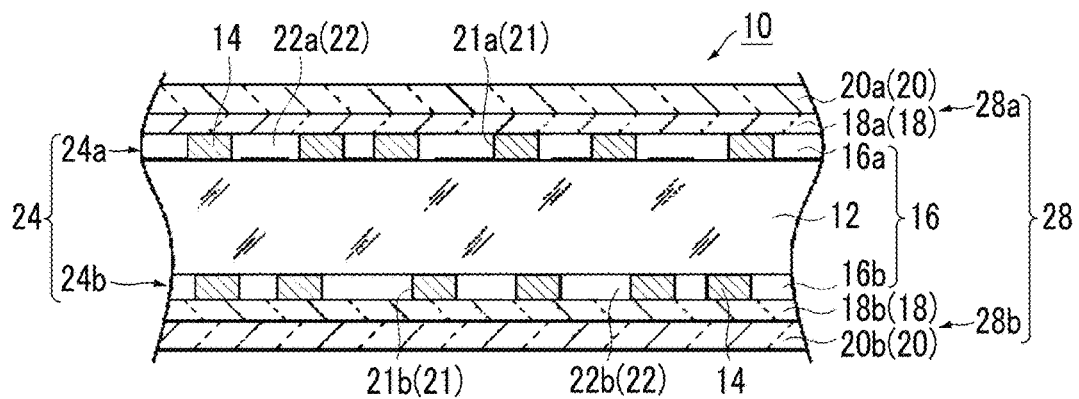
FIG. 1 is a partial cross-sectional view schematically illustrating an example of a conductive film according to a first embodiment of the present invention.

Hereinafter, a conductive film according to the present invention and a display device including the same are specifically described with reference to a suitable embodiment illustrated in accompanying drawings.

The present invention is to provide a conductive film having a random mesh pattern to be combined with the display, in order to suppress a noise recognized as the overlapping of the irregular mesh-like random pattern (hereinafter, referred to as a random mesh pattern) and the display pixel arrangement (BM) pattern.

Here, with respect to the display pixel arrangement (BM) pattern, in a case where one or more of the metal thin wires forming a mesh and forming the random mesh pattern is formed of one continuous line segment which extends in the longitudinal direction of the subpixels of the pixels of the display and which can be regarded as one and the one line segment traverses one or more subpixels that are arranged in the longitudinal direction in the longitudinal direction, in a case where a total length L (μm) of the one line segment of the continuous metal thin wires that traverses one or more subpixels is set and a total area occupied by the one line segment in one or more traverse subpixels is set as a line width area (total area) $S_L$, the random mesh pattern used in the present invention may be an irregular mesh pattern having a condition constrained by the coverage C (%) represented by Equation (1) as a ratio (percentage) of a total area $S_L$ of the line segment that traverses one or more subpixels and a total area S of one or more subpixels.

$$C = 100 \times S_L / S \qquad (1),$$

However, in the combination of the display device (display) and the random mesh pattern, as illustrated in FIG. 19 with a solid line, in a case where the length L (μm) and the coverage C (%) of the line segment is a combination in which the length L (μm) and the coverage C (%) exist within the region below a predetermined line illustrated with the solid line in FIG. 19, in the xy two-dimensional coordinates having the length L (μm) as the x axis and the coverage C (%) as the y axis, the decrease of the memory cost during the design is attempted by using electronic data of the random mesh pattern as a repeating electronic data of the random mesh pattern in a predetermined small piece, and the conductive film of the present invention in which the entire random mesh pattern is used as a repeating pattern of the random mesh pattern in a small piece is manufactured. Therefore, even in a case where the BM pattern of the display and the random mesh pattern of the conductive film of the present invention are overlapped with each other, the noise is not recognized. According to the present invention, the random mesh pattern may be defined as described above, but in order to cause the repeating shape due to the continuous line segment of the metal thin wire of the random mesh pattern that traverses one or more subpixels of the BM pattern of the display not to be recognized, it is required to provide a constraint to the length L (μm) and the coverage C (%) of the continuous line segment.

Here, the repeating shape is recognized depending on the length L (μm) of the continuous one line segment of the metal thin wire that traverses one or more subpixels that becomes the length of the form and the coverage C (%) that becomes the strength of the form. Accordingly, assuming that the random mesh pattern and the display are overlapped with each other, a random pattern is required to be defined such that repeating shapes of a predetermined numerical value or more are not generated.

Therefore, according to the present invention, in the combination of the random mesh pattern and the BM pattern of the display, it is required that the length L (μm) of the line segment that becomes the length of the form and the coverage C (%) of the intensity of the form is in a predetermined range in which the noise is not recognized or in a region. In order to make this predetermined range clear, the numerical value range is calculated by the simulation.

According to the present invention, the predetermined range of the length L (μm) and the coverage C (%) of the one line segment of the random mesh pattern in which the noise is not recognized is a region below the line of the graph indicated with the solid line in FIG. 19. That is, as illustrated with the solid line in FIG. 19, the predetermined range is a region on the lower side than the line represented by Equation (2) in the xy two-dimensional coordinates.

In a case where $0 < x \leq 168$, $y = 6.7$, in a case where $168 < x \leq 252$, $y = -0.00595x + 7.7$, in a case where $252 < x \leq 378$, $y = -0.00476x + 7.4$, in a case where $378 < x \leq 504$, $y = -0.02143x + 13.7$, and in a case where $504 < x \leq 756$, $y = 2.9$ \qquad (2)

As presented as a maximum value in Table 4, this region is a region below the line obtained by connecting six coordinates (84, 6.7), (168, 6.7), (252, 6.2), (378, 5.6), (504, 2.9), and (756, 2.9) in the xy two-dimensional coordinates illustrated in FIG. 19 and a region in which the length L of one line segment is 84 μm or less and the coverage C is 6.7% or less.

Details of numerical value ranges of the length L (μm) and the coverage C (%) of the one line segment of the random mesh pattern in which the noise is not recognized and details of the simulation for calculating this numerical value range are described below.

Hereinafter, with respect to the conductive film according to the present invention, a conductive film for a touch panel is described as a representative example. The present invention is not limited to this, and any conductive film may be used, as long as the conductive film is a conductive film in which at least one of the wiring patterns arranged on both sides of the transparent base body and arranged on one side via the insulating layer has a wiring portion having a random mesh-like wiring pattern (random mesh pattern) formed of a polygonal shaped cell (opening portion) to which irregularity is applied and which is provided on a display unit having various light emission intensities of a display device. For example, it is obvious that the conductive film may be a conductive film for an electromagnetic wave shield or the like.

The display unit of the display device overlapped with the conductive film of the present invention is not particularly limited, and examples thereof include a liquid crystal display (LCD), a plasma display panel (PDP), an organic light emitting (EL) diode (OLED) using organic electro-luminescence (Organic EL) (OEL), an organic electro-luminescence display (organic EL display (OELD)), an inorganic EL (electro-luminescence) display, and electronic paper.

Details are described below, but a display unit (hereinafter, referred to as a display) of a display device overlapped with the conductive film of the present invention is not particularly limited, as long as the display unit is a display unit which is arranged in a pixel arrangement pattern (hereinafter, referred to as a BM pattern) of a pixel including a plurality of subpixels that emit light in a plurality of colors including at least three colors different from each other, for example, three colors of red (R), green (G), and blue (B), and in which the brightness of each subpixel (color filter) depending on the light emission intensity (brightness) may be considered in the evaluation of the visibility of the noise due to the overlapping of the conductive film. As in the related art, for example, the display unit may be a display unit in which repeating periods and intensities (shapes and sizes) of subpixels (color filters), that is, the subpixel arrangement patterns (shapes, sizes, and periods of subpixels) are the same in a plurality of colors such as RGB and which has a BM pattern that can be represented by the G subpixel. As in the OELD, the display unit may be a display unit having a BM pattern including subpixel arrangement patterns which are not the same in all of the plurality of colors, that is, which are different in at least two colors.

The display of the display device that becomes a target of the present invention may be a display having high a light emission intensity as in a high resolution smart phone, a tablet device, and the like, may be a display having a low light emission intensity as in a low resolution desktop computer, television (TV), and the like, and may be a display having a medium light emission intensity as in a medium resolution notebook, and the like.

Figure 2:
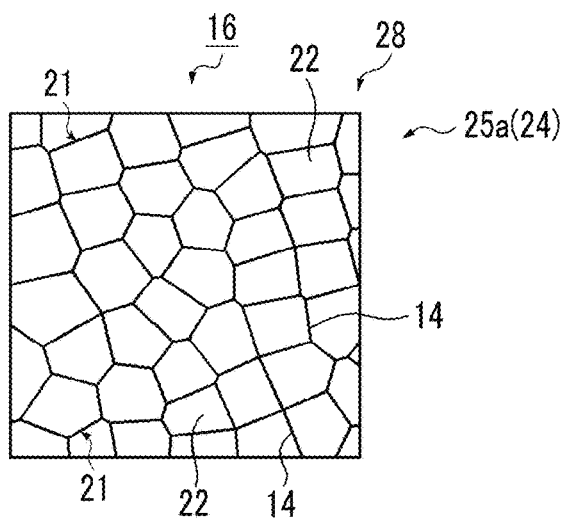
FIG. 2 is a plan view schematically illustrating an example of a random mesh-like wiring pattern including a Voronoi polygon of a wiring portion of the conductive film illustrated in FIG. 1.

FIG. 1 is a partial cross-sectional view schematically illustrating an example of a conductive film according to a first embodiment of the present invention, and FIG. 2 is a plan view schematically illustrating an example of a wiring pattern of a wiring portion of the conductive film illustrated in FIG. 1.

As illustrated in these drawings, a conductive film 10 according to the present embodiment is a conductive film that is provided on a display unit of a display device and that has a wiring pattern excellent in view of restraining the generation of a noise with respect to a black matrix (BM) of the display unit, particularly, a wiring pattern optimized in view of visibility of a noise with respect to a BM pattern in a case where of being overlapped with a BM pattern and has a transparent base body 12; a first wiring portions 16a that is formed on one surface (upper surface in FIG. 1) of the transparent base body 12, that is formed of a plurality of metal thin wires (hereinafter, referred to as a metal thin wire) 14, and that becomes a first electrode portion; a first protective layer 20a that is adhered to the almost entire surface of the first wiring portions 16a via a first adhesive layer 18a so as to cover the metal thin wires 14; a second wiring portion (electrode) 16b that is formed on the other surface of the transparent base body 12 (the lower surface in FIG. 1), that is formed of the plurality of metal thin wires 14, and that becomes a second electrode portion; and a second protective layer 20b that is adhered to the almost entire surface of the second wiring portions 16b via a second adhesive layer 18b.

Hereinafter, the first wiring portions 16a and the second wiring portions 16b may be collectively and simply referred to as wiring portions 16, the first adhesive layer 18a and the second adhesive layer 18b may be collectively and simply referred to as adhesive layers 18, and the first protective layer 20a and the second protective layer 20b may be collectively and simply referred to as protective layers 20.

The transparent base body 12 is formed of a material having insulating properties and high transmittance, and examples thereof include a material such as a resin, glass, and silicon. Examples of the resin include polyethylene terephthalate (PET), polymethyl methacrylate (PMMA), polypropylene (PP), and polystyrene (PS).

The metal thin wire 14 is not particularly limited, as long as the metal thin wire 14 is a metal thin wire that forms a shape of a wavy line and has high conductivity, and examples thereof include a metal thin wire formed of a wire rod of gold (Au), silver (Ag), or copper (Cu). The line width of the metal thin wire 14 is preferably narrow in view of visibility, but may be, for example, 30 µm or less. In the use of the touch panel, the line width of the metal thin wire 14 is preferably 0.1 µm to 15 µm, more preferably 1 µm to 9 µm, and even more preferably 2 µm to 7 µm.

The wiring portions 16 (16a and 16b) form the conductive portion of the present invention and have a plurality of metal thin wires 14 in a wavy line shape having the wiring patterns 24 (24a and 24b) formed by the mesh wirings 21 (21a and 21b) arranged in a mesh shape. Specifically, as illustrated in FIG. 2, the wiring patterns 24 (24a and 24b) are mesh patterns in which opening portions (cell) 22 (22a and 22b) are arranged in a predetermined random shape in which the plurality of metal thin wires 14 cross each other, for example, a random polygonal shape.

As illustrated in FIG. 2, the wiring portions 16 (16a and 16b) are formed of wiring layers 28 (28a and 28b) having the metal thin wires 14 and the wiring patterns 24 (24a and 24b) in a random mesh shape by opening portions (cells) 22 (22a and 22b) between the adjacent metal thin wires 14. The wiring patterns 24a and 24b are a wiring pattern to which irregularity is applied, by causing opening portions formed with a plurality of metal thin wires to be formed in a random polygonal shape, that is, a random mesh pattern 25a. In a case where this random mesh pattern 25a has a different shape from those of the opening portions 22 formed by the metal thin wires 14, the shapes may be two different kinds of opening shapes, may be random polygonal shapes in which the number of vertices is one or more, and may be any random mesh patterns.

In the example illustrated in FIG. 1, the wiring patterns 24 have the random mesh pattern 25a as the wiring patterns 24a and 24b, as illustrated in FIG. 2.

Figure 3:
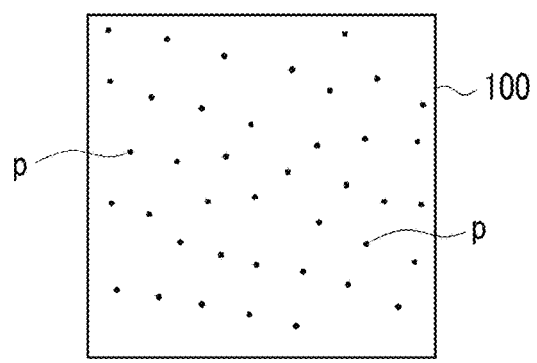
FIG. 3 is a diagram schematically illustrating an example of a dot cutout image showing seed points (dots) generated at optional intervals in one plane region in order to form a Voronoi polygon forming the random mesh pattern illustrated in FIG. 2.

Here, the random mesh pattern 25a illustrated in FIG. 2, which is a wiring pattern to which irregularity is applied has a wiring shape having the opening portions 22 formed of a Voronoi polygon determined according to a Voronoi diagram (Voronoi tessellation method) using a plurality of seed points p that are present in a plurality of positions at optional intervals in one plane region 100 as illustrated in FIG. 3, as a standard.

FIG. 3 illustrates a dot cutout image obtained by generating dots in a plurality of positions randomly selected at optional intervals in the one plane region 100 as the plurality of seed points p, in order to form a Voronoi polygon for forming the random mesh pattern illustrated in FIG. 2.

In the random mesh pattern 25a illustrated in FIG. 2, regions in a plurality of random polygonal shapes that surround the plurality of seed points p illustrated in FIG. 3 according to the Voronoi diagram (Voronoi tessellation method), that is, a plurality of Voronoi polygon regions are respectively demarcated. Here, it is illustrated that the plurality of Voronoi polygon regions partitioned by the Voronoi diagram are an aggregate of points at which the seed points p are the closest points. Here, the Euclidean distance is used as the distance function, but various functions may be used.

As the random mesh pattern used in the present invention, a random mesh pattern (not illustrated) having a wiring shape having the opening portions 22 formed of the Delaunay triangle determined according to Delaunay diagram (Delaunay triangle division method) based on the plurality of seed points illustrated in FIG. 3. The Delaunay triangle division method is a method of demarcating a region of a triangle by connecting adjacent seed points among the plurality of seed points p. Accordingly, for example, the plurality of Delaunay triangle regions having any one of the plurality of seed points as vertices can be demarcated respectively.

The random mesh pattern used in the present invention is not limited to the random mesh pattern having a shape of an opening portion (cell) such as the Voronoi polygon or the Delaunay triangle, and any patterns may be used as long as the patterns are random mesh patterns.

For example, the random mesh pattern may be a random mesh pattern or the like obtained by randomizing a regular fixed pattern of a regular polygon such as a diamond shape by several %, for example, 10% or less. The random mesh pattern does not include a pattern obtained by randomizing only a pitch of a regular fixed pattern of a regular polygon or a pattern obtained by randomizing only the angle thereof.

Figure 4:
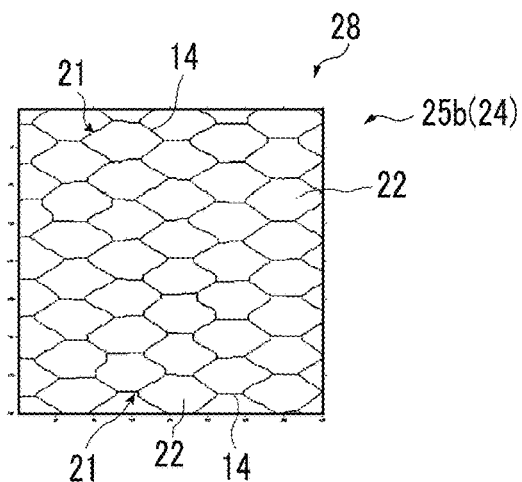
FIG. 4 is a plan view schematically illustrating another example of the random mesh-like wiring pattern in a wiring portion of the conductive film of the present invention.

Examples of the random mesh pattern having anisotropy include a random mesh pattern as illustrated in FIG. 4.

The random mesh pattern as illustrated in FIG. 4 is a random pattern having directionality between a regular fixed mesh pattern (hereinafter, also referred to as a fixed pattern) with strong frequency peak intensity and strong directionality and a random mesh pattern (hereinafter, representatively referred to as a Voronoi random pattern) having a shape of an opening portion (cell) such as the Voronoi polygon or the Delaunay triangle with weak frequency peak intensity and weak directionality.

Here, in the anisotropic random mesh pattern 25b illustrated in FIG. 4, an original figure of the opening shape of the opening portion 22 is a diamond shape, and the center of the opening of the opening portion 22 varies, for example, by about 5%, preferably 10% to 15%, more preferably 15% to 20% in an average value, and thus the anisotropic random mesh pattern 25b can be manufactured as below.

Figure 5A:
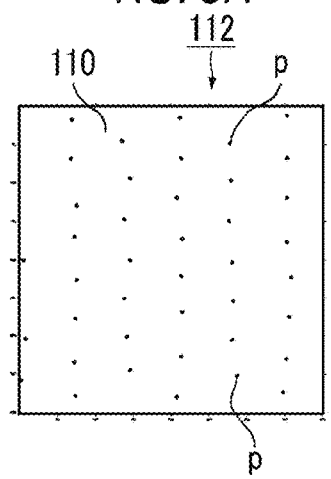
FIG. 5A is a diagram schematically illustrating an example of a dot cutout image showing seed points (dots) generated at optional intervals in one plane region in order to generate a polygonal shape forming the random mesh-like wiring pattern illustrated in FIG. 4.

First, as illustrated in FIG. 5A, a dot cutout image 112 obtained by arranging the seed points (dots) p at a plurality of position randomly selected at optional intervals, for example, at a plurality of positions at optional intervals selected by using a random number and the like, in one plane region 110, as a point that becomes the center of a closed space such as a diamond shape is manufactured. The seed points p may be arranged by arranging dots regularly in the plane region 110 in advance and shifting the intervals between the dots in a random direction by 360 degrees using the standard deviation or the like.

Figure 5B:
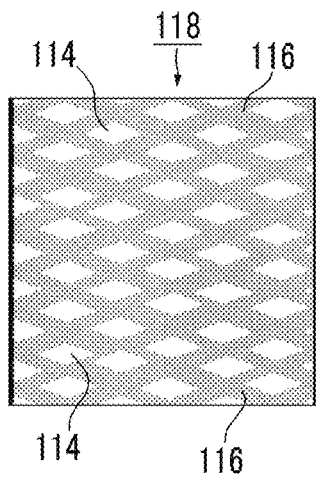
FIG. 5B is a diagram schematically illustrating an example of a diamond shaped pattern image convoluting diamond shaped patterns at positions of dots in the dot cutout image illustrated in FIG. 5A.

Subsequently, as illustrated in FIG. 5B, a diamond shaped pattern 114 including the opening portions 22 at positions of the seed points p illustrated in FIG. 5A which are arranged in the plane region 110 is convoluted such that the adjacent diamond shaped patterns 114 are spaced from each other and a boundary region 116 is present between the both, so as to manufacture a diamond shaped pattern image 118. In the illustrated example, the diamond shaped patterns 114 are convoluted at the seed points p, but the present invention is not limited to the diamond shape and may be a polygonal shape including regular polygons such as a triangle such as an equilateral triangle and an isosceles triangle, a rectangle such as a foursquare, a rectangle, and a parallelogram, a pentagon such as a regular pentagon, and a hexagon such as a regular hexagon.

Subsequently, in order to thin the boundary region 116 of the diamond shaped pattern image 118 illustrated in FIG. 5B, a thinning treatment, for example, a thinning treatment of matlab manufactured by The MathWorks, Inc. is performed.

Here, the thinning treatment is performed by repeating the contraction of the boundary region 116 by removing the pixel of the edge portion of the boundary region 116 and the expansion of the diamond shaped pattern 114 by removing the pixel in an edge portion of the diamond shaped pattern 114, so as to obtain a thin wire having the same line width.

In this manner, it is possible to form a random mesh pattern 25b illustrated in FIG. 4.

The metal thin wire 14 in this shape can be easily formed in a well-known method such as the etching of a metal layer such as a silver layer.

Figure 6A:
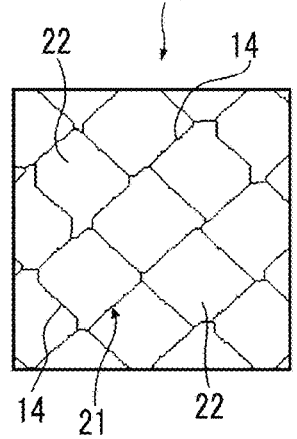
FIG. 6A is a plan view schematically illustrating another example of the random mesh-like wiring pattern in the wiring portion of the conductive film of the present invention.
Figure 6B:
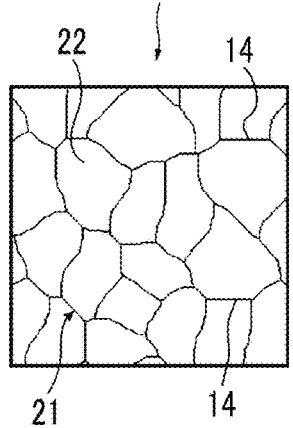
FIG. 6B is a plan view schematically illustrating another example of the random mesh-like wiring pattern in the wiring portion of the conductive film of the present invention.
Figure 6C:
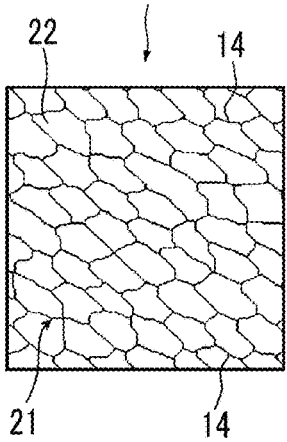
FIG. 6C is a plan view schematically illustrating another example of the random mesh-like wiring pattern in the wiring portion of the conductive film of the present invention.

In addition to the random mesh pattern 25b illustrated in FIG. 4, which has an original figure of the diamond shaped pattern 114 illustrated in FIG. 5B, examples of the random mesh pattern having anisotropy include a random mesh pattern 25c illustrated in FIG. 6A which has an original figure of a diamond shape different from the diamond shaped pattern 114 illustrated in FIG. 5B, a random mesh pattern 25d illustrated in FIG. 6B which has an original figure of a hexagon, and a random mesh pattern 25e illustrated in FIG. 6C which has an original figure of a parallelogram.

Hereinafter, the description is made using the random mesh pattern 25a illustrated in FIG. 2 as a representative example, but it is obvious that the same may be applied to the random mesh patterns 25b, 25c, 25d, and 25e illustrated in FIGS. 4, 6A, 6B, and 6C.

Details are described below, but even in a case where the composite wiring patterns 24 of the upper and lower wiring patterns 24a and 24b are used, in view of noise visibility, the conductive film 10 of the present invention may have an optimized random mesh pattern with respect to the predetermined brightness (brightness image data) of the BM pattern of the display unit. In this case, even in a case where the composite wiring patterns 24 are used, with respect to the BM pattern of the predetermined brightness, the wiring pattern that is optimized in view of noise visibility refers to a group of one or more wiring patterns of which the noise is not recognized by eyes of a human, with respect to the BM pattern of the predetermined brightness. In the present specification, the visibility of the noise refers to a degree in which the noise is not recognized.

Accordingly, even in a case where the composite wiring patterns 24 are used, the random mesh pattern 25a illustrated in FIG. 2 may be a random mesh pattern optimized in view of noise visibility, even to the predetermined brightness (brightness image data) of the BM pattern of the display unit, may be a random mesh pattern in which an evaluation index of the noise in which the transmittance image data of the random mesh pattern 25a obtained from the composite image data of the composite wiring patterns 24 overlapped as the upper and lower wiring patterns 24a and 24b and the brightness image data of the BM pattern of the respective colors in a case where a plurality of colors of light of the display are respectively lit becomes a predetermined evaluation threshold value or less, and may be a random mesh pattern optimized in view of noise visibility with respect to the BM pattern of the predetermined brightness of the display unit that can sufficiently suppress the generation of the noise and that can improve visibility by overlapping the display screen of the display in the predetermined light emission intensity, without change.

In the random mesh pattern 25a optimized in this manner, disconnection (break) may be included on a side (mesh wiring 21) of the metal thin wires 14 forming the opening portions 22. As the shape of the mesh-like wiring pattern which has a break like this, a shape of the mesh-like wiring pattern of the conductive film disclosed in the specification of JP2014-553082 relating to an application of the present applicant may be applied.

Figure 7:
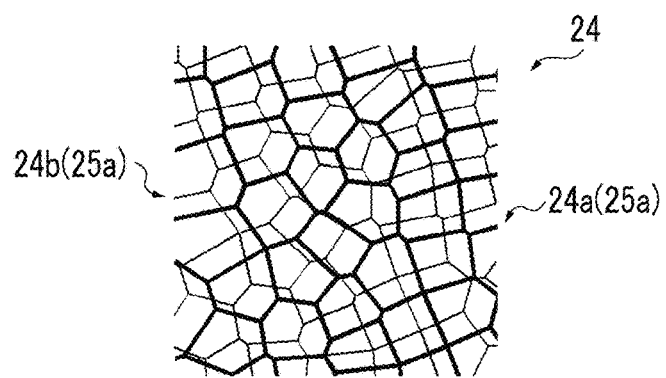
FIG. 7 is a plan view schematically illustrating an example of a composite wiring pattern obtained by overlapping wiring patterns in upper and lower wiring portions of the conductive film illustrated in FIG. 1.
Figure 8:
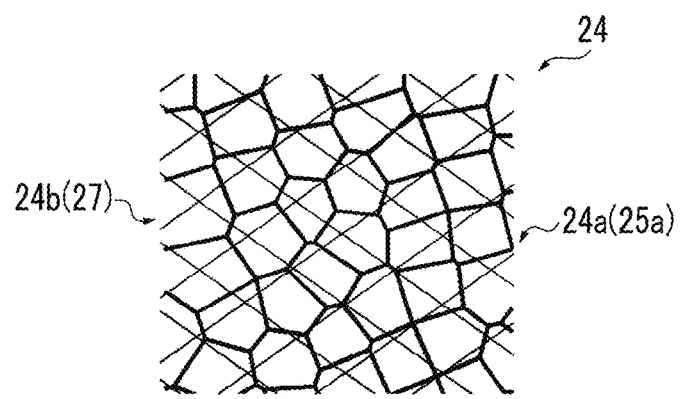
FIG. 8 is a plan view schematically illustrating an example of a composite wiring pattern obtained by overlapping wiring patterns in upper and lower wiring portions of the conductive film according to another embodiment of the present invention.

In the conductive film 10 according to the embodiment illustrated in FIG. 1, the plurality of metal thin wires 14 of the upper first wiring portions 16a (on the viewing side) of the transparent base body 12 and the plurality of metal thin wires 14 of the lower second wiring portions 16b (on the display side) have the random mesh patterns 25a to which the irregularity is applied as illustrated in FIG. 2 respectively as the wiring patterns 24a and 24b and form the composite wiring patterns 24 to which irregularity is applied, by the overlapping of the upper and lower wiring patterns 24a and 24b to which irregularity is applied, as illustrated in FIG. 7. In FIG. 7 and FIG. 8 described below, for easier understanding, the plurality of metal thin wires 14 forming the upper wiring patterns 24a are illustrated with bold lines, and the plurality of metal thin wires 14 forming the lower wiring patterns 24b are illustrated with thin lines, but the widths of the bold lines and thin lines obviously do not indicate the line widths of the metal thin wires 14, and the line widths may be identical to or different from each other.

That is, as illustrated in FIG. 1, all of the first and second wiring portions 16a and 16b are formed with a plurality of metal thin wires having the random mesh pattern 25a to which irregularity is applied as illustrated in FIG. 2, but the present invention is not limited thereto, and at least a portion of any one of the wiring portions 16 may also have a plurality of metal thin wires having the random mesh pattern 25a to which irregularity is applied as illustrated in FIG. 2.

In this manner, all or a portion of the metal thin wires of the upper and lower wiring portions 16 (the wiring portion 16a or 16b) of the conductive film is formed with the random mesh pattern 25a to which the irregularity is applied (randomized), by randomizing the mesh-like wiring pattern that is composed by the combination of wiring patterns of both of wiring portions 16, so as to randomize light that passes through the mesh-like wiring pattern, such that the noise visibility can be improved by the interference of the display and the wiring pattern.

For example, as illustrated in FIG. 8, the first and second wiring portions 16a and 16b may be formed with a plurality of metal thin wires having different wiring patterns. In the example illustrated in FIG. 8, as illustrated in FIG. 2, the upper first wiring portions 16a of the transparent base body 12 are formed with the plurality of metal thin wires 14 having the random mesh pattern 25a to which irregularity is applied and the lower second wiring portions 16b of the transparent base body 12 are formed with the plurality of metal thin wires 14 having a regular fixed pattern 27 formed of an opening portion of a diamond shaped shape. However, on the contrary, the first wiring portions 16a are formed with the plurality of metal thin wires 14 having the fixed pattern 27, and the second wiring portions 16b are formed with the plurality of metal thin wires 14 having the random mesh pattern 25a. In this manner, irregularity may be applied to the composite wiring pattern obtained by overlapping the random mesh pattern 25a and the regular fixed pattern 27.

Figure 9:
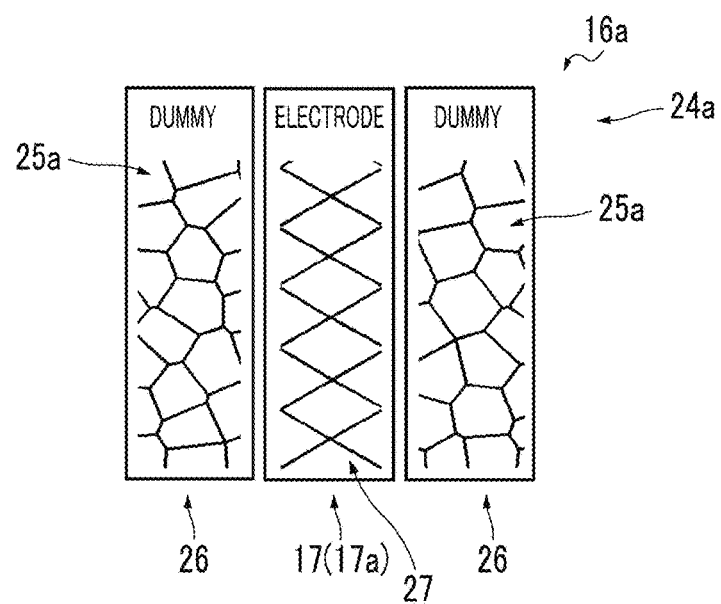
FIG. 9 is a plan view schematically illustrating an example of the wiring pattern of the upper wiring portions of the conductive film according to another embodiment of the present invention.
Figure 10:
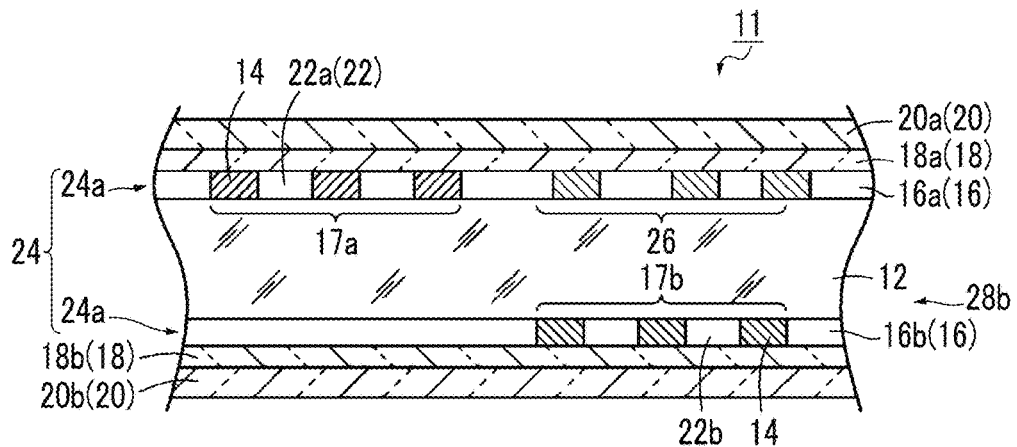
FIG. 10 is a partial cross-sectional view schematically illustrating an example of a conductive film according to a second embodiment of the present invention.

Otherwise, as illustrated in FIG. 9, as described above, at least one of the plurality of metal thin wires 14 of the first and second wiring portions 16a and 16b is divided by the disconnection (break) to an electrode portion 17 forming the wiring layer 28 and dummy electrode portions (non-electrode portions) 26, any one of the electrode portion 17 and the dummy electrode portions 26 is formed with the plurality of metal thin wires 14 having the random mesh pattern 25a as illustrated in FIG. 2, and the other thereof is formed with the plurality of metal thin wires 14 having the regular fixed pattern 27 (with reference to FIG. 8), so as to obtain a form such as a conductive film 11 of a second embodiment of the present invention as illustrated in FIG. 10 described below. In this manner, irregularity may be applied to the composite wiring pattern obtained by the combination of the random mesh pattern 25a and the regular fixed pattern 27 and the overlapping with the random mesh pattern 25a or the fixed pattern 27 or to the composite wiring pattern obtained by the combination and the overlapping the random mesh pattern 25a and the fixed pattern 27 with each other.

In FIG. 9, the upper first wiring portion 16a of the transparent base body 12 is divided into an electrode portion 17a and the two dummy electrode portions 26 on both sides thereof by disconnection (break), the two dummy electrode portions 26 are formed with the plurality of metal thin wires 14 having the random mesh pattern 25a as illustrated in FIG. 2, and the electrode portion 17a is formed with the plurality of metal thin wires 14 having the regular fixed pattern 27, but it is obvious that the reverse thereof is possible.

With respect to the examples illustrated in FIGS. 7, 8, 9, and the like, both of the first wiring portions 16a and the second wiring portions 16b are formed with the plurality of metal thin wires 14, but the present invention is not limited thereto, and one wiring portion may be formed with wirings patternized by a transparent conductive film such as indium tin oxide (ITO) (tin-doped indium oxide), instead of the plurality of metal thin wires 14. In this case, a wiring pattern of the other wiring portion becomes a composite wiring pattern.

In the example illustrated in FIG. 8 and a reverse example thereof, wirings patternized by ITO may be used instead of the plurality of metal thin wires 14 having the regular fixed pattern 27 of one of the first wiring portion 16a and the second wiring portion 16b.

As illustrated in FIG. 9, in a case where one of the first wiring portions 16a and the second wiring portions 16b is divided by disconnection (break) into the electrode portion 17a and the two dummy electrode portions 26 on both sides thereof and one of the electrode portion 17a and the dummy electrode portions 26 is formed with the plurality of metal thin wires 14 having the randomized wiring pattern, a wiring patternized by ITO may be used, instead of the plurality of metal thin wires 14 forming the other wiring portion.

The structure of the conductive film 11 of the second embodiment of the present invention illustrated in FIG. 10 is described below.

As described above, the first protective layer 20a is adhered to the almost entire surface of the wiring layers 28a formed of the first wiring portions 16a by the first adhesive layer 18a so as to cover the metal thin wires 14 of the first wiring portions 16a. The second protective layer 20b is adhered to the almost entire surface of the wiring layers 28b formed of the second wiring portions 16b by the second adhesive layer 18b so as to cover the metal thin wires 14 of the second wiring portions 16b.

Here, examples of the material of the adhesive layers 18 (the first adhesive layer 18a and the second adhesive layer 18b) include a wet lamination adhesive, a dry lamination adhesive, or a hot melt adhesive, and the material of the first adhesive layer 18a and the material of the second adhesive layer 18b may be identical to or different from each other.

In the same manner as in the transparent base body 12, the protective layers 20 (the first protective layer 20a and the second protective layer 20b) are formed of a material with high transmittance including a resin, a glass, and silicon, but the material of the first protective layer 20a and the material of the second protective layer 20b may be identical to or different from each other.

It is preferable that all of a refractive index n1 of the first protective layer 20a and a refractive index n2 of the second protective layer 20b are the same as or close to a refractive index n0 of the transparent base body 12. In this case, a relative refractive index nr1 of the transparent base body 12 to the first protective layer 20a and a relative refractive index nr2 of the transparent base body 12 to the second protective layer 20b become values close to 1.

Here, the refractive index according to the present specification means a refractive index at light having a wavelength of 589.3 nm (D line of sodium), and is defined by ISO 14782:1999 (corresponding to JIS K 7105) which is the international standard, for a resin. The relative refractive index nr1 of the transparent base body 12 to the first protective layer 20a is defined by nr1=(n1/n0), and the relative refractive index nr2 of the transparent base body 12 to the second protective layer 20b is defined by nr2=(n2/n0).

Here, the relative refractive index nr1 and the relative refractive index nr2 may be in the range of 0.86 to 1.15 and more preferably 0.91 to 1.08.

In a case where the ranges of the relative refractive index nr1 and the relative refractive index nr2 are limited to these ranges and the transmittance of light between members of the transparent base body 12 and the protective layers 20 (20a and 20b) are controlled, the visibility of the noise may be enhanced and improved.

In the conductive film 10 of the embodiment illustrated in FIG. 1, all of the upper and lower wiring portions 16 (16a and 16b) on both sides of the transparent base body 12 b become electrode portions including the plurality of metal thin wires 14, but the present invention is not limited thereto, and at least one of the first and second wiring portions 16a and 16b may be formed by the electrode portion and the non-electrode portion (dummy electrode portion).

FIG. 10 is a partial cross-sectional view schematically illustrating an example of the conductive film according to the second embodiment of the present invention. The plan view of the wiring pattern of the conductive film according to the present second embodiment illustrated in FIG. 10 is the same as the plan views of the wiring patterns illustrated in FIGS. 2, 4, 6A to 6C, 7, and 8, and thus the description thereof is omitted.

As illustrated in FIG. 10, the conductive film 11 of the present second embodiment has the first wiring portion 16a formed of the first electrode portion 17a and the dummy electrode portion 26 formed on one surface (the upper side of FIG. 10) of the transparent base body 12, the second wiring portion 16b formed of the second electrode portion 17b formed on the other side (the lower side of FIG. 10) of the transparent base body 12, the first protective layer 20a adhered via the first adhesive layer 18a to the almost entire surface of the first wiring portion 16a formed of the first electrode portion 17a and the dummy electrode portion 26, and the second protective layer 20b adhered via the second adhesive layer 18b to the almost entire surface of the second wiring portion 16b formed of the second electrode portion 17b.

In the conductive film 11, the first electrode portion 17a and the dummy electrode portion 26 are respectively formed of the plurality of metal thin wires 14, and both are formed as the wiring layers 28a on one surface (upper side of FIG. 10) of the transparent base body 12, and the second electrode portion 17b is formed of the plurality of metal thin wires 14, and is formed as the wiring layers 28b on the other surface (lower side of FIG. 10) of the transparent base body 12. Here, the dummy electrode portion 26 is formed on one surface (upper side of FIG. 10) of the transparent base body 12 in the same manner as the first electrode portion 17a, but is formed of the plurality of metal thin wires 14 arranged in the same manner as the positions corresponding to the plurality of metal thin wires 14 of the second electrode portion 17b formed on the other surface (lower side of FIG. 10).

The dummy electrode portion 26 is arranged to be spaced from the first electrode portion 17a at predetermined intervals, and in a state of being electrically insulated from the first electrode portion 17a.

In the conductive film 11 of the present embodiment, also on one surface (upper side of FIG. 10) of the transparent base body 12, the dummy electrode portion 26 formed of the plurality of metal thin wires 14 corresponding to the plurality of metal thin wires 14 of the second electrode portion 17b formed on the other surface (lower side of FIG. 10) of the transparent base body 12 is formed, and thus scattering caused by the metal thin wire on one surface (upper side of FIG. 10) of the transparent base body 12 can be controlled, and thus the electrode visibility can be improved.

The first electrode portion 17a and the dummy electrode portion 26 of the wiring layer 28a has the metal thin wire 14 and the mesh-like wiring pattern 24a due to the opening portions 22. In the same manner as the first electrode portion 17a, the second electrode portion 17b of the wiring layer 28b has the metal thin wire 14 and the mesh-like wiring pattern 24b due to the opening portions 22. As described above, the transparent base body 12 is formed of an insulating material, and the second electrode portion 17b is under the state of electrically insulated from the first electrode portion 17a and the dummy electrode portion 26.

The first and second electrode portions 17a and 17b and the dummy electrode portion 26 can be formed of the same material of the wiring portion 16 of the conductive film 10 illustrated in FIG. 1 in the same manner.

The first protective layer 20a is adhered to the almost entire surface of the wiring layer 28a formed of the first electrode portion 17a and the dummy electrode portion 26 by the first adhesive layer 18a so as to cover the metal thin wire 14 of the first electrode portion 17a and the dummy electrode portion 26 of the first wiring portion 16a.

The second protective layer 20b is adhered to the almost entire surface of the wiring layer 28b formed of the second electrode portion 17b by the second adhesive layer 18b so as to cover the metal thin wire 14 of the second electrode portion 17b of the second wiring portion 16b.

the first and second adhesive layer 18a and 18b of the conductive film 11 and the first and second protective layer 20a and 20b illustrated in FIG. 10 are the same as those of the conductive film 10 illustrated in FIG. 1, and thus the description thereof is omitted.

In the conductive film 11 of the present embodiment, the second wiring portion 16b including the second electrode portion 17b does not have the dummy electrode portion, but the present invention is not limited thereto, and the dummy electrode portion formed of the metal thin wires 14 may be arranged under the state of being electrically insulated from the second electrode portion 17b in the second wiring portions 16b, to be spaced from the first electrode portion 17a at predetermined intervals at a position corresponding to the first electrode portion 17a of the first wiring portion 16a.

Also in the conductive film 11 of the present embodiment, the dummy electrode portion 26a is provided to the first wiring portion 16a, or such a dummy electrode portion is provided to the second wiring portion 16b, such that each mesh wiring of the first electrode portion 17a of the first wiring portion 16a and the second electrode portion 17b of the second wiring portion 16b are arranged in a corresponding manner. Therefore, the scattering due to the metal thin wire on one surface (for example, upper or lower side of FIG. 10) of the transparent base body 12 can be controlled, so as to improve the electrode visibility.

Figure 11:
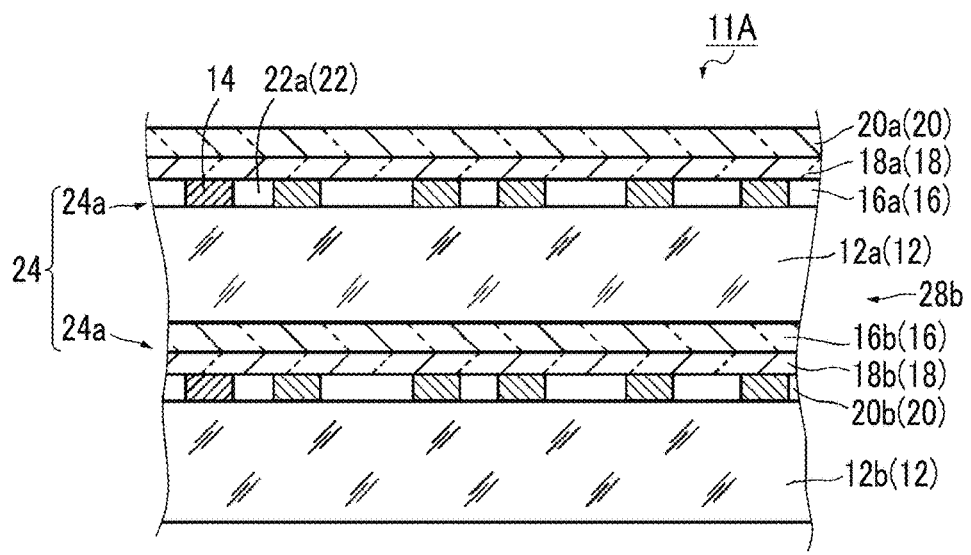
FIG. 11 is a partial cross-sectional view schematically illustrating an example of a conductive film according to a third embodiment of the present invention.

In the conductive films 10 and 11 of the first and second embodiment illustrated in FIGS. 1 and 10, the wiring portions 16 (16a and 16b) are respectively formed on both sides of the upper and lower sides of the transparent base body 12, but the present invention is not limited thereto and may be a structure in which two conductive film elements obtained by forming the wiring portion 16 formed of the plurality of metal thin wires 14 on one surface (upper surface in FIG. 11) of the transparent base body 12 as in the conductive film 11A of a third embodiment of the present invention illustrated in FIG. 11 and adhering the protective layer 20 to the almost entire surface of the wiring portions 16 via the adhesive layer 18, so as to cover the metal thin wire 14 are repeated.

In FIG. 11, the conductive film 11A of the third embodiment of the present invention illustrated in FIG. 11 has the lower transparent base body 12b, the second wiring portion 16b formed of the plurality of metal thin wires 14 formed on the upper surface of the transparent base body 12b, the second protective layer 20b adhered to the second wiring portion 16b via the second adhesive layer 18b, the upper transparent base body 12a arranged to be adhered to the second protective layer 20b, for example, by an adhesive or the like, the first wiring portion 16a formed of the plurality of metal thin wires 14 formed on the upper surface of the transparent base body 12a, and the protective layer 20a that is adhered to the first wiring portion 16a via the adhesive layer 18a.

Here, all or a portion of at least one of the first wiring portion 16a and the metal thin wire 14 of the second wiring portion 16b is the random mesh pattern 25a to which the irregularity is applied illustrated in FIG. 2.

Figure 12:
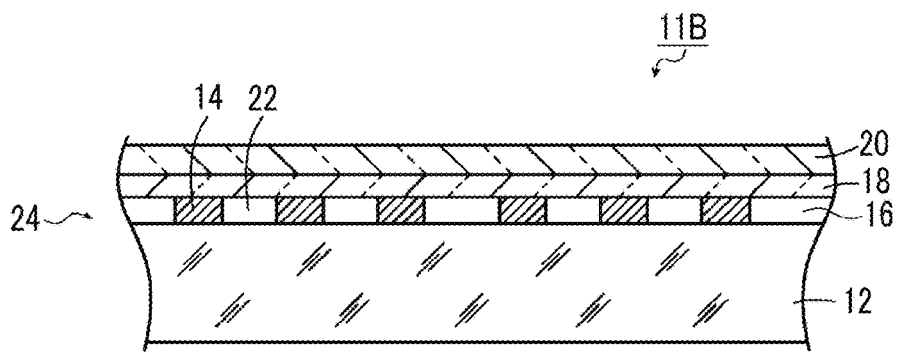
FIG. 12 is a partial cross-sectional view schematically illustrating an example of a conductive film according to a fourth embodiment of the present invention.

In the conductive films 10, 11, and 11A of the first, second, and third embodiments illustrated in FIGS. 1, 10 and 11, the wiring portions 16 (16a and 16b) are respectively formed on both sides of the upper and lower sides of the transparent base body 12 or 12a, but the present invention is not limited thereto and may be a single layer wiring pattern of one layer wiring structure obtained by forming the wiring portion 16 formed of the plurality of metal thin wires 14 only on one surface (upper surface in FIG. 12) of the transparent base body 12 as in the conductive film 11B of a fourth embodiment of the present invention illustrated in FIG. 12 and adhering the protective layer 20 to the almost entire surface of the wiring portions 16 via the adhesive layer 18, so as to cover the metal thin wire 14.

Here, the metal thin wire 14 of the wiring portion 16 is any one of the random mesh patterns 25a, 25b, 25c, 25d, and 25e respectively illustrated in FIGS. 2, 4, 6A, 6B, and 6C.

Figure 13:
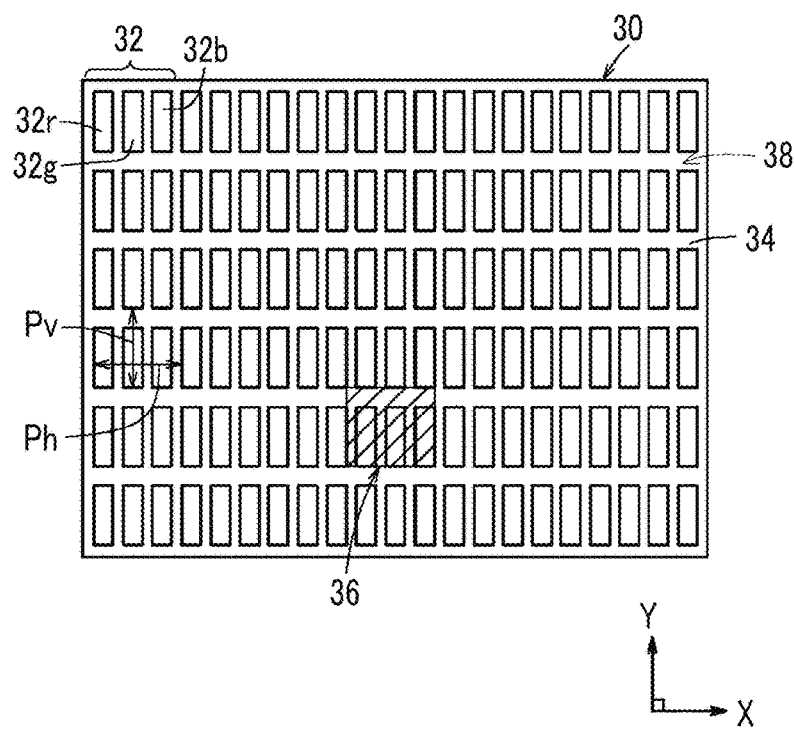
FIG. 13 is a diagram schematically illustrating an example of a portion of a pixel arrangement pattern of a display unit to which the conductive film according to the present invention is applied.

For example, the conductive film 10, 11, 11A, and 11B of the first, second, third, and fourth embodiments of the present invention are applied to a touch panel (44: see FIG. 14) of a display unit 30 (display) schematically illustrated in FIG. 13, but with respect to the pixel arrangement (BM) pattern of each color of the display, the single layer wiring pattern or the composite wiring pattern has an irregular wiring pattern excellent in the noise visibility.

Here, according to the present invention, in the combination of the random mesh pattern and the BM pattern of the display, as described above, the length L (μm) and the coverage C (%) of the continuous line segment of the metal thin wire that traverse one or more subpixels, which are two factors that determines the visibility of the noise by the repeating shape are required in the lower region of the line of the graph illustrated in FIG. 19 indicated by the numerical value range in which the repeating shape (noise) is not recognized. Details of this numerical value range and the simulation for the calculation thereof are described below.

The conductive film of the present invention is basically formed as above.

FIG. 13 is a diagram schematically illustrating an example of a portion of a pixel arrangement pattern of a display unit to which the conductive film according to the present invention is applied.

As a portion thereof is illustrated in FIG. 13, the plurality of pixels 32 are arranged in a matrix shape in the display unit 30, and a predetermined pixel arrangement pattern is formed. One pixel 32 is formed by arranging three subpixels (a red color subpixel 32r, a green color subpixel 32g, and a blue color subpixel 32b) in a horizontal direction. One subpixel has a rectangular shape that vertically extends in the perpendicular direction. The arrangement pitch (horizontal pixel pitch Ph) of the pixel 32 in a horizontal direction and the arrangement pitch (perpendicular pixel pitch Pv) of the pixel 32 in the perpendicular direction are almost the same. That is, the shape (see a shaded region 36) formed with the one pixel 32 and a black matrix (BM) 34 (pattern material) surrounding the one pixel 32 becomes a four-square. The aspect ratio of the one pixel 32 is not one, and a length in a horizontal direction (width)>a length in perpendicular direction (height) is satisfied.

As clearly illustrated in FIG. 13, the pixel arrangement pattern formed by each of the subpixels 32r, 32g, and 32b of the plurality of pixels 32 is defined by a BM pattern 38 of a BM 34 respectively surrounding these subpixels 32r, 32g, and 32b, the noise generated in a case where the display unit 30 and the conductive film 10 or 11 is overlapped is generated due to the interference between the BM pattern 38 of the BM 34 of the display unit 30 and the wiring pattern 24 of the conductive film 10, 11, 11A, or 11B, and thus, strictly speaking, the BM pattern 38 is a reverse pattern of the pixel arrangement pattern, but, herein, the BM pattern 38 is considered as the same pattern.

For example, in a case where the conductive film 10, 11, 11A, or 11B is arranged on a display panel of the display unit 30 having the BM pattern 38 formed by the BM 34, since at least one of the wiring patterns 24a and 24b is the random mesh pattern 25a or the wiring pattern 24 of the conductive film 11B is the single layer wiring pattern 24, the wiring pattern 24 (the composite wiring pattern of the wiring patterns 24a and 24b) of the conductive film 10, 11, 11A, or 11B is optimized in view of noise visibility with respect to a BM (pixel arrangement) pattern 38, and the noise is not recognized, such that the interference of the spatial frequency between the arrangement period of the pixel 32 and the wiring arrangement of the metal thin wire 14 of the conductive film 10, 11, 11A, or 11B becomes weak, the generation of the noise is suppressed, and the visibility of the noise becomes excellent. Hereinafter, the conductive film 10 is described as the representative example, but the same is applied to the conductive film 11, 11A, or 11B.

The display unit 30 illustrated in FIG. 13 may be formed with a display panel such as a liquid crystal panel, a plasma panel, an organic EL panel, and an inorganic EL panel, and the light emission intensity thereof may be different according to the resolution.

The BM pattern of the display that can be applied to the present invention and the light emission intensity thereof are not particularly limited and may be the BM pattern of the display well-known in the art and the light emission intensity thereof. However, for example, as illustrated in FIGS. 15A, 15B, 16A, 16B, and 16C, a display in which the periods or the intensities of the respective RGB colors of the OLED and the like are different may be used, as illustrated in FIGS. 13, 17A, or 17B, a display in which the BM pattern is formed of RGB subpixels having the same shape and the variation in the intensities in the subpixels is great, or a display in which the variation in the intensities in the subpixels is small and only the G subpixel (channel) having the highest intensity is considered may be used, and particularly, a display having high intensity as in a smart phone or a tablet PC may be used.

Figure 15A:
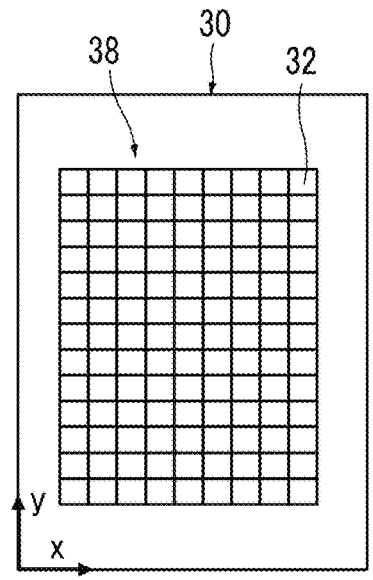
FIG. 15A is a diagram schematically illustrating an example of a portion of a pixel arrangement pattern of a display unit to which the conductive film according to the present invention is applied.
Figure 15B:
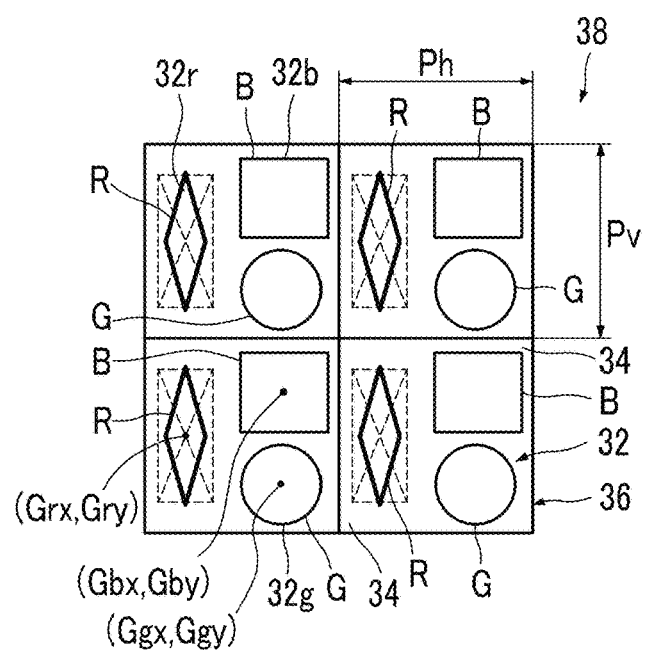
FIG. 15B is a partially enlarged view of the pixel arrangement pattern of FIG. 15A.

FIGS. 15A and 15B are a diagram schematically illustrating an example of a pixel arrangement pattern of a display unit to which the conductive film of the present invention is applied, and a partially enlarged view of a portion thereof.

As illustrated in FIG. 15A, the plurality of pixels 32 are arranged in a matrix shape in the display unit 30, and a predetermined pixel arrangement pattern is formed. As illustrated in FIG. 13, the one pixel 32 is formed by arranging the three subpixels (the red color subpixel 32r, the green color subpixel 32g, and the blue color subpixel 32b) in a horizontal direction.

According to the present invention, it is required that the pixel arrangement pattern of the display unit satisfies any one of three conditions: a condition in which at least two subpixels in a plurality of subpixels, for example, three subpixels in the illustrated example in one pixel have different shapes, a condition in which periods of the subpixel arrangement patterns formed by the arrangements of the respective subpixels with respect to at least two subpixels among a plurality of (three) subpixels in one pixel are different, and a condition in which a plurality of (three) subpixels in one pixel are arranged in a row in one direction. According to the present invention, the period of the subpixels in one pixel is included in the period of the subpixel arrangement pattern, that is, the period of the subpixel (color filter).

In the example illustrated in FIG. 15B, the subpixel 32r has a diamond shape vertically extending in the y (perpendicular) direction in the drawing and arranged in the pixel 32 of the foursquare on the left side of the drawing, the subpixel 32g has a circle shape and is arranged in the pixel 32 on the lower right side of the drawing, and the subpixel 32b has a rectangular shape (foursquare) and is arranged in the pixel 32 on the upper right side of the drawing. The shapes of the three subpixels 32r, 32g, and 32b in one pixel in the pixel arrangement pattern 38 are different from each other, and thus the display unit 30 illustrated in FIGS. 15A and 15B corresponds to a case where the intensities are different and corresponds to a case where a plurality of (three) subpixels in one pixel are arranged in a row in one direction.

In the illustrated example, it is considered that the arrangement pitch (the horizontal pixel pitch Ph) of the pixel 32 in a horizontal direction and the arrangement pitch (perpendicular pixel pitch Pv) of the pixel 32 in the perpendicular direction are almost the same, and thus can be indicated by a pixel pitch Pd. That is, a region formed of the three subpixels 32r, 32g, and 32b of the one pixel 32 and the pixel area region 36 formed with the black matrix (BM) 34 (pattern material) surrounding these subpixels 32r, 32g, and 32b become foursquares. The pixel area region 36 corresponds to the one pixel 32, and thus, hereinafter, the pixel area region 36 is also referred to as a pixel.

As the pixel pitch Pd (horizontal and perpendicular pixel pitches Ph and Pv), any pitches may be possible, as long as the pitch is a pitch corresponding to the resolution of the display unit 30, and examples thereof include a pitch in the range of 84 µm to 264 µm.

As in the illustrated example, the shapes of the subpixels 32r, 32g, and 32b in one pixel are respectively a diamond shape, a circle shape, and a foursquare shape, but the present invention is not limited thereto, and the one pixel 32 in which three subpixels having the same shape as illustrated in FIG. 13 are arranged in a row in a horizontal direction of the drawing may repeat in a horizontal direction and a perpendicular direction and the pixel arrangement pattern 38 in which the periods and the intensities of the subpixels (color filters) are the same in all of the three RGB subpixels may be provided.

Figure 16A:
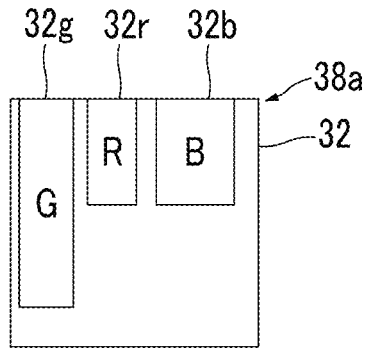
FIG. 16A is a diagram schematically illustrating an example of a constitutional unit of a pixel arrangement pattern in which at least one of shapes and periods of three subpixels applied to the present invention are different.
Figure 16B:
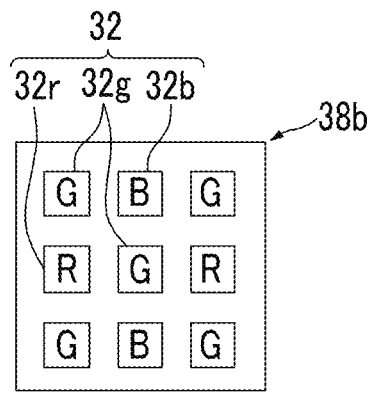
FIG. 16B is a diagram schematically illustrating another example of a constitutional unit of a pixel arrangement pattern in which at least one of shapes and periods of three subpixels applied to the present invention are different.
Figure 16C:
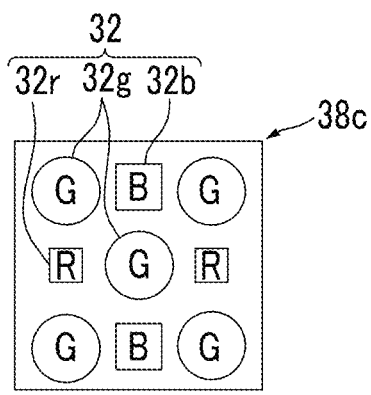
FIG. 16C is a diagram schematically illustrating another example of a constitutional unit of a pixel arrangement pattern in which at least one of shapes and periods of three subpixels applied to the present invention are different.
Figure 17A:
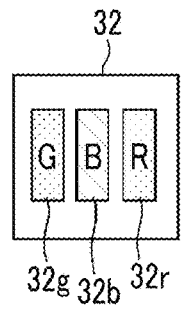
FIG. 17A is a diagram schematically illustrating an example of unevenness in intensities of three subpixels in a pixel of a pixel arrangement pattern of the display unit illustrated in FIG. 13.
Figure 17B:
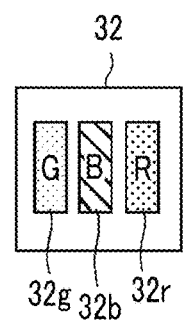
FIG. 17B is a diagram schematically illustrating another example of unevenness in intensities of three subpixels in a pixel of a pixel arrangement pattern of the display unit illustrated in FIG. 13.

Otherwise, the subpixels (color filters) 32r, 32g, and 32b of the opening shape called a pentile structure illustrated in FIGS. 16A to 16C may be provided, and the pixel arrangement pattern formed of these subpixels 32r, 32g, and 32b may be provided.

As illustrated in FIG. 16A, the shapes of the three subpixels 32r, 32g, and 32b of the pixel 32 may be different (the shapes are the rectangular shapes, but the sizes thereof may be different). This case corresponds to the intensities are different. In this case, it is considered that the periods of the subpixels are the same.

That is, in the example illustrated in FIG. 16A, the three subpixels 32r, 32g, and 32b having different shapes are used as one pixel so as to form a pixel arrangement pattern 38a, and all of the periods of the subpixel arrangement patterns of the respective three subpixels 32r, 32g, and 32b are the same as the period of the pixel arrangement pattern 38a.

According to the present invention, the fact that the shapes of the subpixels are different is defined to include a case where the shapes of the subpixels are different from each other and also a case where the sizes of the subpixels are different from each other.

As illustrated in FIG. 16B, the shapes of the three subpixels 32r, 32g, and 32b may be the same, and the repeating periods (periods of subpixel arrangement pattern) of the subpixel 32g and the subpixels 32r and 32b may be different from each other. In this example, the period of the subpixel 32g is a half of the period of the subpixels 32r and 32b. In this case, it is considered that the intensities of the subpixels are the same.

That is, in the example illustrated in FIG. 16B, four subpixels of the two subpixels 32g and the subpixels 32r and 32b are used as one pixel 32 so as to form the pixel arrangement pattern 38b, and all of the periods of the subpixel arrangement patterns of the respective subpixels 32r and 32b are the same as the period of the pixel arrangement pattern 38a, but the period of the subpixel arrangement pattern of the subpixel 32g becomes a half of the period of the pixel arrangement pattern 38a.

As illustrated in FIG. 16C, the subpixel 32g and the subpixels 32r and 32b may have different repeating periods (periods of subpixel patterns) and have different forms (shapes and sizes). In this case, the periods and the intensities of the subpixels correspond to the other cases.

That is, in the example illustrated in FIG. 16C, as in the example illustrated in FIG. 16B, four subpixels of the two subpixels 32*g* and the subpixels 32*r* and 32*b* are used as one pixel 32 so as to form the pixel arrangement pattern 38*c*, and all of the periods of the subpixel arrangement patterns of the respective subpixels 32*r* and 32*b* are the same as the period of the pixel arrangement pattern 38*a*, but the period of the subpixel arrangement pattern of the subpixel 32*g* becomes a half of the period of the pixel arrangement pattern 38*a*.

FIG. 17A illustrates the BM structure of the pixel in which the variation in the intensities of the GBR subpixels is great and which is formed of the RGB subpixels having the same size, and FIG. 17B illustrates the BM structure of the pixel in which the variation in the intensities of the GBR subpixels is great and which is formed of RGB subpixels having the same size and the wiring pattern of the conductive film can be designed in a case where only the G subpixel having the highest intensity is considered.

Figure 18A:
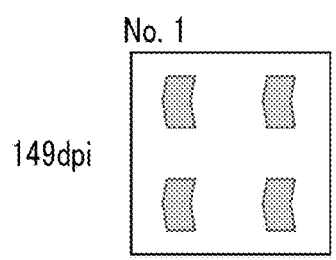
FIG. 18A is a schematic diagram illustrating an example of a 2×2 pixel repeating unit of a representative subpixel of a pixel arrangement pattern of a display unit having different resolutions, shapes, and intensities.
Figure 18B:
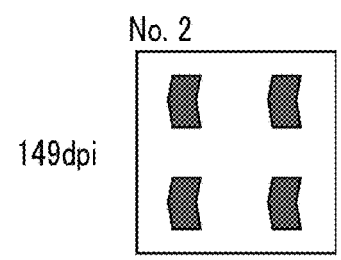
FIG. 18B is a schematic diagram illustrating another example of the 2×2 pixel repeating unit of the representative subpixel of the pixel arrangement pattern of the display unit having different resolutions, shapes, and intensities.
Figure 18C:
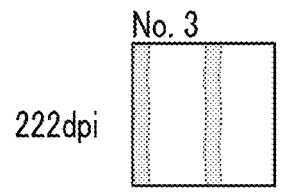
FIG. 18C is a schematic diagram illustrating another example of the 2×2 pixel repeating unit of the representative subpixel of the pixel arrangement pattern of the display unit having different resolutions, shapes, and intensities.
Figure 18D:
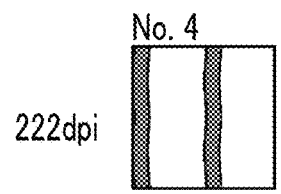
FIG. 18D is a schematic diagram illustrating another example of the 2×2 pixel repeating unit of the representative subpixel of the pixel arrangement pattern of the display unit having different resolutions, shapes, and intensities.
Figure 18E:
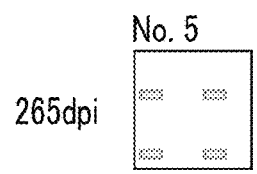
FIG. 18E is a schematic diagram illustrating another example of the 2×2 pixel repeating unit of the representative subpixel of the pixel arrangement pattern of the display unit having different resolutions, shapes, and intensities.
Figure 18F:
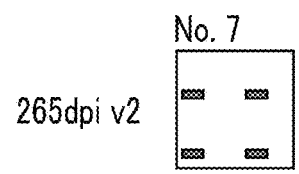
FIG. 18F is a schematic diagram illustrating another example of the 2×2 pixel repeating unit of the representative subpixel of the pixel arrangement pattern of the display unit having different resolutions, shapes, and intensities.
Figure 18G:
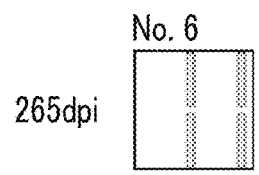
FIG. 18G is a schematic diagram illustrating another example of the 2×2 pixel repeating unit of the representative subpixel of the pixel arrangement pattern of the display unit having different resolutions, shapes, and intensities.
Figure 18H:
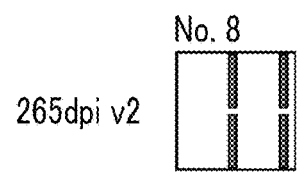
FIG. 18H is a schematic diagram illustrating another example of the 2×2 pixel repeating unit of the representative subpixel of the pixel arrangement pattern of the display unit having different resolutions, shapes, and intensities.
Figure 18I:
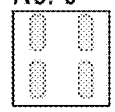
FIG. 18I is a schematic diagram illustrating another example of the 2×2 pixel repeating unit of the representative subpixel of the pixel arrangement pattern of the display unit having different resolutions, shapes, and intensities.
Figure 18J:
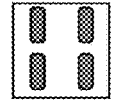
FIG. 18J is a schematic diagram illustrating another example of the 2×2 pixel repeating unit of the representative subpixel of the pixel arrangement pattern of the display unit having different resolutions, shapes, and intensities.
Figure 18K:
FIG. 18K is a schematic diagram illustrating another example of the 2×2 pixel repeating unit of the representative subpixel of the pixel arrangement pattern of the display unit having different resolutions, shapes, and intensities.
Figure 18L:
FIG. 18L is a schematic diagram illustrating another example of the 2×2 pixel repeating unit of the representative subpixel of the pixel arrangement pattern of the display unit having different resolutions, shapes, and intensities.
Figure 18M:
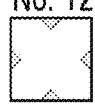
FIG. 18M is a schematic diagram illustrating another example of the 2×2 pixel repeating unit of the representative subpixel of the pixel arrangement pattern of the display unit having different resolutions, shapes, and intensities.
Figure 18N:
FIG. 18N is a schematic diagram illustrating another example of the 2×2 pixel repeating unit of the representative subpixel of the pixel arrangement pattern of the display unit having different resolutions, shapes, and intensities.
Figure 18O:
FIG. 18O is a schematic diagram illustrating another example of the 2×2 pixel repeating unit of the representative subpixel of the pixel arrangement pattern of the display unit having different resolutions, shapes, and intensities.
Figure 18P:
FIG. 18P is a schematic diagram illustrating another example of the 2×2 pixel repeating unit of the representative subpixel of the pixel arrangement pattern of the display unit having different resolutions, shapes, and intensities.

The resolutions and the intensities of the BMs with 2×2 pixels of the display that can be used in the present invention are illustrated in FIGS. 18A to 18P. The BMs illustrated in FIGS. 18A to 18P are respectively BMs of which any one of resolutions, shapes, and intensities (brightness) are different. In FIGS. 18A to 18P, only the G channel (G subpixel) is illustrated, and the B channel (B subpixel) and the R channel (R subpixel) are not illustrated, but it is obvious that the resolutions and the shapes are the same. In the present invention, the visibility is determined by the coverage of the subpixel, and thus, as described below, it is obvious that the intensities and the opening shapes of the subpixels are not considered.

All of FIGS. 18A and 18B illustrate four G subpixels which have the resolution of 149 dpi and have strip shapes bent to the left in the center in the drawings, illustrate that intensities in a case of being standardized with the intensity in a display as a standard are respectively 0.5 and 1.0, and correspond to BMs of BM Nos. 1 and 2 used in the examples below.

All of FIGS. 18C and 18D illustrate four G subpixels which have the resolution of 222 dpi and have vertically continuous belt-shapes in the drawings, illustrate that intensities in a case of being standardized with the intensity in a display as a standard are respectively 0.5 and 1.0, and correspond to BMs of BM Nos. 3 and 4 used in the examples below.

All of FIGS. 18E and 18F illustrate four G subpixels which have the resolution of 265 dpi and have flat plate shapes arranged in the lateral direction in the drawings, illustrate that intensities in a case of being standardized with the intensity in a display as a standard are respectively 0.5 and 1.0, and correspond to BMs of BM Nos. 5 and 7 used in the examples below.

All of FIGS. 18G and 18H illustrate four G subpixels which have the resolution of 265 dpi and have narrow belt-shapes arranged in the machine direction in the drawings, illustrate that intensities in a case of being standardized with the intensity in a display as a standard are respectively 0.5 and 1.0, and correspond to BMs of BM Nos. 6 and 8 used in the examples below.

All of FIGS. 18I and 18J illustrate four G subpixels which have the resolution of 326 dpi and have rectangular shapes arranged in the lateral direction in the drawings, illustrate that intensities in a case of being standardized with the intensity in a display as a standard are respectively 0.5 and 1.0, and correspond to BMs of BM Nos. 9 and 10 used in the examples below.

All of FIGS. 18K and 18L illustrate four G subpixels which have the resolution of 384 dpi and have rectangular shapes arranged in the lateral direction in the drawings, illustrate that intensities in a case of being standardized with the intensity in a display as a standard are respectively 0.5 and 1.0, and correspond to BMs of BM Nos. 11 and 13 used in the examples below.

All of FIGS. 18M and 18N illustrate four G subpixels which have the resolution of 384 dpi and have small triangular shapes arranged in the four side directions in the drawings, illustrate that intensities in a case of being standardized with the intensity in a display as a standard are respectively 0.5 and 1.0, and correspond to BMs of BM Nos. 12 and 14 used in the examples below.

All of FIGS. 18O and 18P illustrate four G subpixels which have the resolution of 440 dpi and have rectangular shapes arranged in the machine direction in the drawings, illustrate that intensities in a case of being standardized with the intensity in a display as a standard are respectively 0.5 and 1.0, and correspond to BMs of BM Nos. 15 and 16 used in the examples below.

In a case where the conductive film 10, 11, or 11A is arranged on a display panel of the display unit 30 having the BM pattern 38 formed by the BM 34 that defines the subpixel arrangement patterns of RGB described above, the wiring pattern 24 is a random mesh pattern optimized as the composite wiring pattern in view of the noise visibility with respect to the brightness value of the BM (pixel arrangement) pattern 38 including the RGB subpixel arrangement patterns, and thus the interference of the spatial frequency between the arrangement period or the intensity of the pixel 32 and the wiring arrangement of the metal thin wire 14 of the conductive film 10, 11, or 11A is little, and the generation of the noise is suppressed.

Strictly speaking, the pixel arrangement pattern of the display used in a case where the noise is optimized is defined by the subpixel arrangement patterns of a plurality of colors, for example, respectively colors of RGB, the shapes of subpixels, the repeating frequency, and the like, and thus it is required to accurately define the resolution of the subpixel with respect to the resolution of the display. However, according to the present invention, it is required to use the light intensity of the pixel arrangement pattern of the display, for example, brightness value (brightness image data), and thus in view of the intensity and the frequency, only a question is what arrangement subpixels (indicating a single channel) having a certain intensity have, so it is not required to clearly distinguish RGB. Accordingly, in order to design a random mesh pattern optimal for a display, the worst value in a case where a single body of RGB is lit may be used, in a case where the quantitative value of the noise is calculated. Accordingly, in order to design an irregular (random) mesh pattern optimal for a display, the worst value in a case where a single body of RGB is lit may be used, in a case where an evaluation index of the noise, that is, a quantitative value is calculated.

Figure 14:
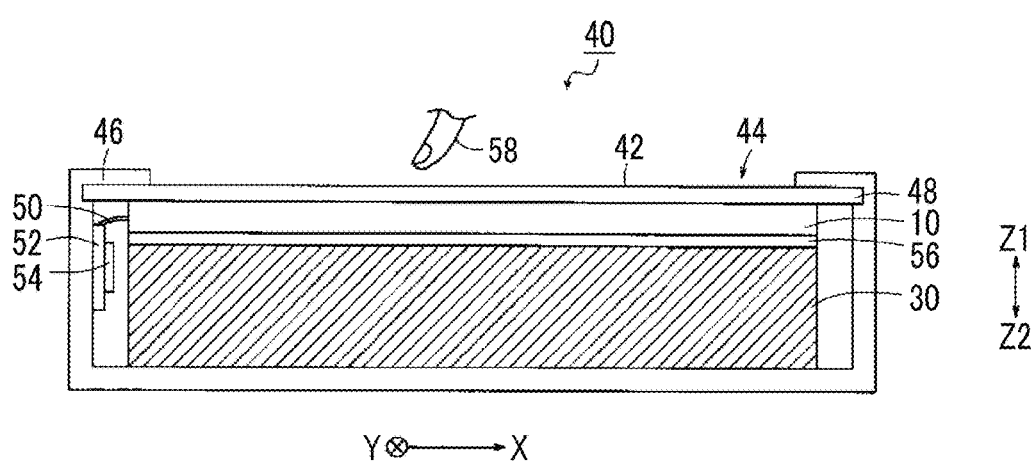
FIG. 14 is a cross-sectional view schematically illustrating an example of a display device to which the conductive film illustrated in FIG. 1 is incorporated.

Subsequently, the display device obtained by incorporating the conductive film of the present invention is described with reference to FIG. 14. In FIG. 14, a projection type capacitance type touch panel obtained by incorporating the conductive film 10 according to the second embodiment of the present invention is described as a representative example as the display device 40, but it is obvious that the present invention is not limited thereto.

As illustrated in FIG. 14, a display device 40 has the display unit 30 (see FIG. 13) that can display a color image and/or a monochrome image, a touch panel 44 that can detect a contact position from an input surface 42 (an arrow Z1 direction side), and a housing 46 that contains the display unit 30 and the touch panel 44. The user can access the touch panel 44 via a large opening portion provided on one surface (the arrow Z1 direction side) of the housing 46.

The touch panel 44 includes a cover member 48 laminated on one surface (arrow Z1 direction side) of the conductive film 10, a flexible substrate 52 that is electrically connected to the conductive film 10 via a cable 50, and a detecting controller 54 arranged on the flexible substrate 52, in addition to the conductive film 10 (see FIGS. 1 and 2).

The conductive film 10 is adhered to one surface (the arrow Z1 direction side) of the display unit 30 via an adhesive layer 56. The conductive film 10 is arranged on a display screen so as to face the display unit 30 on the other main surface side (the second wiring portion 16b side).

The cover member 48 performs a function as the input surface 42, by covering one surface of the conductive film 10. In a case where a direct contact with a contact body 58 (for example, a finger or a stylus pen) is prevented, the generation of scratches and the adhesion of dust and the like can be restrained, and the conductivity of the conductive film 10 can be stabilized.

The material of the cover member 48 may be, for example, glass or a resin film. In a state in which one surface (an arrow Z2 direction side) of the cover member 48 is coated with silicon oxide or the like, the cover member 48 may be closely attached to one surface (the arrow Z1 direction side) of the conductive film 10. In order to prevent damage due to rubbing or the like, the conductive film 10 and the cover member 48 may be bonded to each other.

The flexible substrate 52 is an electronic substrate with flexibility. In the present illustrated example, the flexible substrate 52 is fixed to the side inner wall of the housing 46, but the arrangement position may be changed in various ways. In a case where the conductive contact body 58 is brought into contact with (or brought closer to) the input surface 42, the detecting controller 54 forms an electronic circuit that captures a change in electrostatic capacitance between the contact body 58 and the conductive film 10 and detects the contact position (or proximity position) thereof.

The display device to which conductive film of the present invention is applied is basically formed as above.

Subsequently, according to the present invention, the visibility of the noise of the wiring pattern of the conductive film with respect to the pixel arrangement (BM) pattern of the display device having the predetermined intensity (brightness value) is described.

As described above, in a case where the random mesh pattern is overlapped with the BM pattern of the display, in the xy two-dimensional coordinates in which the length L (μm) and the coverage C (%) of one continuous line segment formed of one or more metal thin wires that form the random mesh pattern that traverses one or more subpixels of the display are the x axis and the y axis, it is required that the conductive film according to the present invention is included in a region below a line represented by Equation (2), that is, a region surrounded by this line and the x axis.

In a case where $0 < x \leq 168$, $y = 6.7$, in a case where $168 < x \leq 252$, $y = -0.00595x + 7.7$, in a case where $252 < x \leq 378$, $y = -0.00476x + 7.4$, in a case where $378 < x \leq 504$, $y = -0.02143x + 13.7$, and in a case where $504 < x \leq 756$, $y = 2.9$ \hfill (2)

According to the present invention, the reason of the limitation described above is because the present inventors have found out that the following points may be technical rules.

Figure 20A:
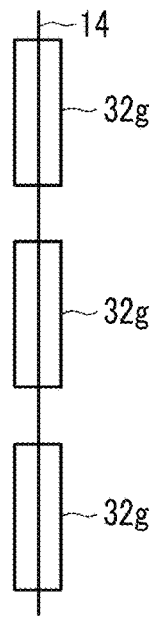
FIG. 20A is a schematic diagram illustrating an example presenting a state in which one continuous line segment of the metal thin wire forming the random mesh-like wiring pattern of the conductive film passes through one or more subpixels of the pixel arrangement pattern of the display unit.
Figure 20B:
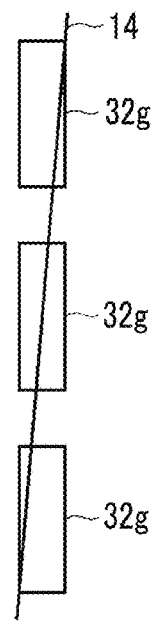
FIG. 20B is a schematic diagram illustrating another example presenting a state in which one continuous line segment of the metal thin wire forming the random mesh-like wiring pattern of the conductive film passes through one or more subpixels of the pixel arrangement pattern of the display unit.
Figure 20C:
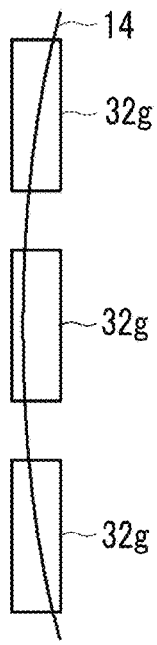
FIG. 20C is a schematic diagram illustrating another example presenting a state in which one continuous line segment of the metal thin wire forming the random mesh-like wiring pattern of the conductive film passes through one or more subpixels of the pixel arrangement pattern of the display unit.

That is, as illustrated in FIGS. 20A to 20C, in a case where the one line segment of the metal thin wire 14 of the random mesh pattern traverses one or more subpixels 32g of the G color of the display, in the illustrated example, three the subpixels 32 in the longitudinal direction, since the length of the metal thin wire 14 that can be regarded as one line segment is long, the metal thin wire 14 is regarded a noise in a case where the line width is more than a certain degree, but in a case where the line width is narrow, even in a case where the length of the metal thin wire 14 is long, the metal thin wire 14 is not recognized as a noise.

Figure 20D:
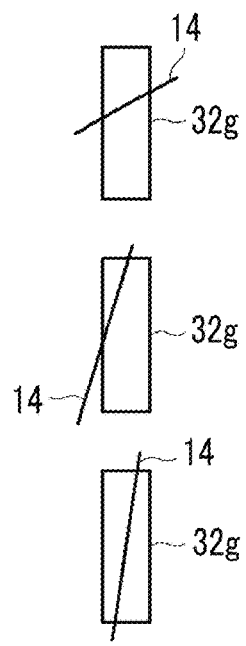
FIG. 20D is a schematic diagram illustrating another example presenting a state in which one continuous line segment of the metal thin wire forming the random mesh-like wiring pattern of the conductive film passes through one or more subpixels of the pixel arrangement pattern of the display unit.

On the contrary, in a case where the metal thin wire 14 crosses or partially obliquely crosses one subpixel as in the upper two subpixels illustrated in FIG. 20D, since the length of the metal thin wire 14 is short, the line width used has the upper limit and does not widen more than a certain degree, and thus the metal thin wire 14 is not recognized as the noise, but in a case where the line width is narrow, even in a case where the length of the metal thin wire 14 is long, the metal thin wire 14 is not recognized as the noise.

In a case where the metal thin wire 14 traverses one subpixel in the longitudinal direction as in the lower one subpixel illustrated in FIG. 20D, according to the line width, the metal thin wire 14 is recognized as the noise.

The present inventors have further found the followings.

The length of the metal thin wire 14 regarded as one line segment may be defined as a total length L (μm) of one or more subpixels that are traversed in the longitudinal direction.

The size of the line width with respect to the subpixel may be defined as the coverage C (%) in which the metal thin wire 14 regarded as one traverse line segment covers one or more subpixels.

Under the definition as above, in a case where constraint conditions are applied to the length L (μm) and the coverage C (%), a conductive film having a random mesh pattern in which a noise is not recognized even in a case where the random mesh pattern is overlapped with the BM pattern of the display may be obtained.

Here, the present inventors have performed a simulation experiment on the length L (μm), the coverage C (%), and the visibility of the noise and have found the region (range) defined by Equation (2) as the conditions of the length L (μm) and the coverage C (%) required for the conductive film having the random mesh pattern in which a noise is not recognized even in a case of being overlapped with the BM pattern of the display.

In the above, according to the present invention, the reason that the range of the length L (μm) and the coverage C (%) of the one line segment of the random mesh pattern of the conductive film are limited to the range defined by Equation (2) is that, in a case where the length L (↑m) and the coverage C (%) are in the range defined by Equation (2), even in a case of the overlapping with the BM pattern of the display, a noise is not recognized, and the visibility is not deteriorated.

As described above, this region may be defined even on two-dimensional coordinates, as a region below a line obtained by connecting six coordinates (84, 6.7), (168, 6.7), (252, 6.2), (378, 5.6), (504, 2.9), and (756, 2.9) in the xy two-dimensional coordinates and a region in which the length L of one line segment is 84 μm or less, and the coverage C is 6.7% or less.

Here, the continuous one line segment formed of one or more metal thin wires is a continuous one line segment in which one or more metal thin wires forming the random mesh pattern extend in the longitudinal direction of the subpixel of the display and which may be regarded as one, and the length L (μm) of the one line segment is a total length of one or more traverse subpixels that are traversed by one line segment in the longitudinal direction, in a case where one line segment traverses one or more subpixels arranged in the longitudinal direction in the longitudinal direction.

Here, the "one continuous line segment regarded as one" may correspond to a straight line or a curved line on one side that form an opening shape formed in a mesh shape and may correspond to a straight line or a curved line in which each one side that forms opening shapes of a plurality of meshes is continuously connected to one. The "traverse subpixel" refers to a subpixel that is traversed by one "continuous line segment regarded as one". The total length L (μm) of one line segment refers to a length obtained by summing only lengths of one or more traverse subpixels that are traversed by one line segment. That is, in a case where the lengths of the subpixels are the same, in a case where the number of subpixels that are traversed by one line segment is set as n and a length of a subpixel is set as Lp, the total length may be indicated by L=n×Lp.

In the examples illustrated in FIGS. 20A to 20C, one line segment of the metal thin wires 14 traverses three subpixels in the G color that are arranged in the longitudinal direction in the longitudinal direction, but the present invention is not limited thereto, and the one line segment may traverse one or more subpixels in the longitudinal direction, and may traverse one or more subpixels in other colors, for example, the R color or the B color in the longitudinal direction.

In the examples illustrated in FIGS. 20A to 20C, one line segment of the metal thin wire 14 is a line segment formed of a continuous straight line or a continuous smoothly curved line, but the present invention is not limited thereto, and in what way the line segment may be curved or bent, as long as the line segment is regarded as one continuous line segment that traverse one or more subpixels in the longitudinal direction. A curve angle of the curve portion of one line segment and a bending angle of the bending portion are not particularly limited, as long as one line segment may be regarded as a continuous line segment, but it is preferable that the angle is, for example, 15° or less. Here, the bending angle is defined as an outer angle of the angle formed by the two line segments forming the bending portion, and the curve angle is defined as an outer angle of an angle formed by two tangent lines in the curve portion on the side where the bending portion is enveloped.

The coverage C (%) represents the ratio (percentage) of covering one or more subpixels that are traversed by one line segment. That is, as described above, in a case where a total area of one or more traverse subpixels that are traversed by one line segment is set as S, and a total area occupied by one line segment in one or more traverse subpixels is set as the line width area $S_L$, the coverage C (%) is represented by Equation (1).

$$C=100\times S_L/S \qquad (1),$$

Here, the total area S of the traverse subpixel refers to a total area of the respective pixels of one or more traverse subpixels that are traversed by one line segment. Accordingly, in a case where the sizes of the subpixels are the same, the number of subpixels that are traversed by one line segment is set as n and the area of the subpixel is set as Sp, the total area may be indicated by S=n×Sp.

The line width area $S_L$ of one line segment refers to a total area occupied by one line segment in each pixel of one or more traverse subpixels that are traversed by one line segment. Accordingly, in a case where the line width of one line segment is set as w and the length of the subpixel is set as Lp in the same manner, the line width area may be indicated by $S_L$=n×w×Lp.

Accordingly, in this case, Equation (1) may be indicated by the equation below.

$$C = 100\times S_L/S = 100\times n\times w\times Lp/(n\times Sp)$$
$$= 100\times w\times Lp/Sp$$

Since the coverage C may be considered as a proportion in which one line segment blocks light passing through subpixels, a transmittance T (%) indicating the proportion of light passing through subpixels which is blocked by one line segment with respect to light passing through the entire subpixels may be used instead of the coverage C. The relationship between the coverage C and the transmittance T may be indicated by the equation below.

$$T=100\times(S-S_L)/S=(100-C)$$

Hereinafter, the simulation experiment with respect to the visibility of the noise performed in the present invention is described.

According to the present invention, an experiment is performed as below.

Figure 21A:
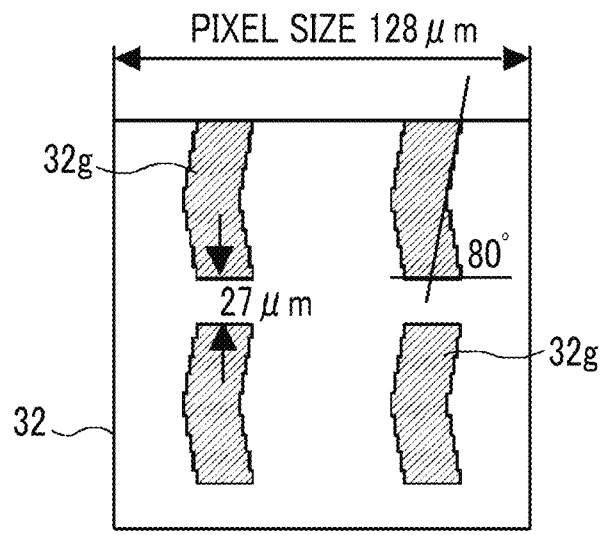
FIG. 21A is a diagram schematically illustrating an example of the pixel arrangement pattern of the display unit used in a simulation experiment according to the present invention.
Figure 21B:
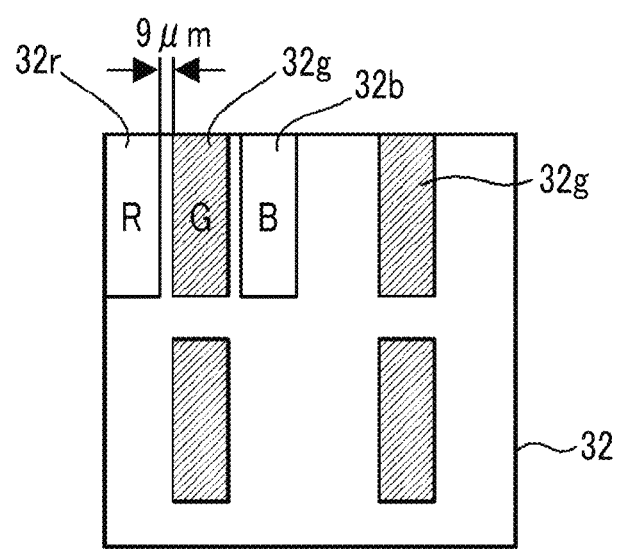
FIG. 21B is a diagram schematically illustrating another example of the pixel arrangement pattern of the display unit used in a simulation experiment according to the present invention.

With respect to the pixel arrangement (BM) pattern 38 of two kinds of displays having different subpixel shapes representatively represented as the G subpixel arrangement patterns illustrated in FIGS. 21A and 21B and the wiring pattern (the random mesh pattern 25a) 24 having the random mesh pattern shapes formed of the Voronoi polygon illustrated in FIG. 2, as simulation samples, these wiring patterns 24 and the BM patterns 38 of respective colors are overlapped with each other, and three sensory evaluation people visually perform sensory evaluation on the noise generated by the interference of the both overlapped in a simulation image of the noise.

The results thereof are presented in Tables 1 to 3.

Here, with respect to the evaluation of the noise, the transmittance data of the wiring pattern 24 is overlapped on the brightness image data of the subpixel arrangement patterns of the respective colors of the pixel arrangement (BM) patterns illustrated in FIGS. 21A and 21B, a simulation image of the noise in which the transmittance image is overlapped with the brightness image is formed and displayed on a display, three sensory evaluation people visually perform sensory evaluation on the displayed simulation image.

Here, the sensory evaluation result is performed by five steps of deterioration scales 1 to 5, a case where the deterioration of the visibility of the noise is recognized and very concerned is evaluated as 1, a case where the deterioration of the visibility of the noise is recognized and concerned is evaluated as 2, a case where the deterioration of the visibility of the noise is recognized and slightly concerned is evaluated as 3, a case where the deterioration of the visibility of the noise is recognized but is not concerned is evaluated as 4, and a case where the deterioration of the visibility of the noise is not recognized is evaluated as 5.

As the visibility of the noise, the deterioration scale 4 is acceptable, but evaluation 5 is more preferable.

According to the present simulation experiment, two kinds of BM patterns having different BM structures illustrated in FIGS. 21A and 21B are used as the BM pattern 38 of the display, the color of the channel is set as the G color, the pixel sizes are three kinds of 128 μm, 254 μm, and 84

μm, the interval (horizontal interval) of the subpixels in different colors is three kinds of 9 μm, 18 μm, and 8 μm, the interval (perpendicular interval) between the upper and lower subpixels in the same color is three kinds of 27 μm, 54 μm, and 20 μm, and in the structures of the subpixels, the longitudinal direction is the perpendicular direction in all cases, and a case where the tilt angle is 80° with respect to the horizontal as a bending structure illustrated in FIG. 21A and a case where the tilt angle is 90° with respect to the horizontal as a rectangular structure illustrated in FIG. 21B are included.

Meanwhile, as the line width of the random mesh pattern 25a, 1 μm and 3 μm are used.

The length L (μm) of one line segment of the metal thin wire 14 forming the random mesh pattern 25a is seven kinds of 0 μm, 84 μm, 168 μm, 252 μm, 378 μm, 504 μm, and 756 μm, which are discrete values corresponding to the size of the subpixels of the two kinds of BM patterns.

The direction of the mesh of the random mesh pattern 25a is two kinds of a case of 0° where the mesh is covered in parallel to the x axis and a case of 90° where the mesh is covered in parallel to the y axis.

TABLE 1

| Pixel size (μm) | Horizontal interval (μm) | Vertical interval (μm) | Structure | Angle (°) | Direction (°) | Length L (μm) | Line width (μm) | Coverage (%) | Deterioration scale |
|---|---|---|---|---|---|---|---|---|---|
| 128 | 9 | 27 | Curved | 80 | 0 | 0 | 1 | 0.0 | 5 |
| 128 | 9 | 27 | Curved | 80 | 0 | 252 | 1 | 2.0 | 5 |
| 128 | 9 | 27 | Curved | 80 | 0 | 378 | 1 | 2.0 | 5 |
| 128 | 9 | 27 | Curved | 80 | 90 | 0 | 1 | 0.0 | 5 |
| 128 | 9 | 27 | Curved | 80 | 90 | 252 | 1 | 5.5 | 4 |
| 128 | 9 | 27 | Curved | 80 | 90 | 378 | 1 | 5.5 | 3 |
| 128 | 9 | 27 | Curved | 80 | 0 | 0 | 3 | 0.0 | 4 |
| 128 | 9 | 27 | Curved | 80 | 0 | 252 | 3 | 4.0 | 4 |
| 128 | 9 | 27 | Curved | 80 | 0 | 378 | 3 | 4.0 | 4 |
| 128 | 9 | 27 | Curved | 80 | 90 | 0 | 3 | 0.0 | 5 |
| 128 | 9 | 27 | Curved | 80 | 90 | 252 | 3 | 11.0 | 2 |
| 128 | 9 | 27 | Curved | 80 | 90 | 378 | 3 | 11.1 | 1.5 |
| 128 | 9 | 27 | Rectangular | 90 | 0 | 0 | 1 | 0.0 | 5 |
| 128 | 9 | 27 | Rectangular | 90 | 0 | 252 | 1 | 2.0 | 5 |
| 128 | 9 | 27 | Rectangular | 90 | 0 | 378 | 1 | 2.0 | 5 |
| 128 | 9 | 27 | Rectangular | 90 | 90 | 0 | 1 | 0.0 | 5 |
| 128 | 9 | 27 | Rectangular | 90 | 90 | 252 | 1 | 5.6 | 4 |
| 128 | 9 | 27 | Rectangular | 90 | 90 | 378 | 1 | 5.6 | 4 |
| 128 | 9 | 27 | Rectangular | 90 | 0 | 0 | 3 | 0.0 | 5 |
| 128 | 9 | 27 | Rectangular | 90 | 0 | 252 | 3 | 3.9 | 5 |
| 128 | 9 | 27 | Rectangular | 90 | 0 | 378 | 3 | 3.9 | 5 |
| 128 | 9 | 27 | Rectangular | 90 | 90 | 0 | 3 | 0.0 | 5 |
| 128 | 9 | 27 | Rectangular | 90 | 90 | 252 | 3 | 11.1 | 2 |
| 128 | 9 | 27 | Rectangular | 90 | 90 | 378 | 3 | 11.1 | 1.5 |

According to the present simulation experiment, two kinds of BM patterns having different BM structures illustrated in FIGS. 21A and 21B are used as the BM pattern 38 of the display, the color of the channel is set as the G color, the pixel sizes are three kinds of 128 μm, 254 μm, and 84 μm, the interval (horizontal interval) of the subpixels in different colors is three kinds of 9 μm, 18 μm, and 8 μm, the interval (perpendicular interval) between the upper and lower subpixels in the same color is three kinds of 27 μm, 54 μm, and 20 μm, and in the structures of the subpixels, the longitudinal direction is the perpendicular direction in all cases, and a case where the tilt angle is 80° with respect to the horizontal as a bending structure illustrated in FIG. 21A and a case where the tilt angle is 90° with respect to the horizontal as a rectangular structure illustrated in FIG. 21B are included.

Meanwhile, as the line width of the random mesh pattern 25a, 1 μm and 3 μm are used.

The length L (μm) of one line segment of the metal thin wire 14 forming the random mesh pattern 25a is seven kinds of 0 μm, 84 μm, 168 μm, 252 μm, 378 μm, 504 μm, and 756 μm, which are discrete values corresponding to the size of the subpixels of the two kinds of BM patterns.

TABLE 2

| Pixel size (μm) | Horizontal interval (μm) | Vertical interval (μm) | Structure | Angle (°) | Direction (°) | Length L (μm) | Line width (μm) | Coverage (%) | Deterioration scale |
|---|---|---|---|---|---|---|---|---|---|
| 254 | 18 | 54 | Curved | 80 | 0 | 0 | 1 | 0.0 | 5 |
| 254 | 18 | 54 | Curved | 80 | 0 | 252 | 1 | 1.0 | 5 |
| 254 | 18 | 54 | Curved | 80 | 0 | 504 | 1 | 1.0 | 5 |
| 254 | 18 | 54 | Curved | 80 | 0 | 756 | 1 | 1.0 | 5 |
| 254 | 18 | 54 | Curved | 80 | 90 | 0 | 1 | 0.0 | 5 |
| 254 | 18 | 54 | Curved | 80 | 90 | 252 | 1 | 2.9 | 5 |
| 254 | 18 | 54 | Curved | 80 | 90 | 504 | 1 | 2.9 | 5 |
| 254 | 18 | 54 | Curved | 80 | 90 | 756 | 1 | 2.9 | 5 |
| 254 | 18 | 54 | Curved | 80 | 0 | 0 | 3 | 0.0 | 5 |
| 254 | 18 | 54 | Curved | 80 | 0 | 252 | 3 | 2.1 | 5 |
| 254 | 18 | 54 | Curved | 80 | 0 | 504 | 3 | 2.1 | 5 |
| 254 | 18 | 54 | Curved | 80 | 0 | 756 | 3 | 2.1 | 5 |

TABLE 2-continued

| Pixel size (μm) | Horizontal interval (μm) | Vertical interval (μm) | Structure | Angle (°) | Direction (°) | Length L (μm) | Line width (μm) | Coverage (%) | Deterioration scale |
|---|---|---|---|---|---|---|---|---|---|
| 254 | 18 | 54 | Curved | 80 | 90 | 0 | 3 | 0.0 | 5 |
| 254 | 18 | 54 | Curved | 80 | 90 | 252 | 3 | 5.3 | 3 |
| 254 | 18 | 54 | Curved | 80 | 90 | 504 | 3 | 5.8 | 3 |
| 254 | 18 | 54 | Curved | 80 | 90 | 756 | 3 | 5.9 | 3 |
| 254 | 18 | 54 | Rectangular | 90 | 0 | 0 | 1 | 0.0 | 5 |
| 254 | 18 | 54 | Rectangular | 90 | 0 | 252 | 1 | 1.0 | 5 |
| 254 | 18 | 54 | Rectangular | 90 | 0 | 504 | 1 | 1.0 | 5 |
| 254 | 18 | 54 | Rectangular | 90 | 0 | 756 | 1 | 1.0 | 5 |
| 254 | 18 | 54 | Rectangular | 90 | 90 | 0 | 1 | 0.0 | 5 |
| 254 | 18 | 54 | Rectangular | 90 | 90 | 252 | 1 | 2.9 | 4 |
| 254 | 18 | 54 | Rectangular | 90 | 90 | 504 | 1 | 2.9 | 3 |
| 254 | 18 | 54 | Rectangular | 90 | 90 | 756 | 1 | 2.9 | 3 |
| 254 | 18 | 54 | Rectangular | 90 | 0 | 0 | 3 | 0.0 | 5 |
| 254 | 18 | 54 | Rectangular | 90 | 0 | 252 | 3 | 2.0 | 5 |
| 254 | 18 | 54 | Rectangular | 90 | 0 | 504 | 3 | 2.0 | 5 |
| 254 | 18 | 54 | Rectangular | 90 | 0 | 756 | 3 | 2.0 | 5 |
| 254 | 18 | 54 | Rectangular | 90 | 90 | 0 | 3 | 0.0 | 5 |
| 254 | 18 | 54 | Rectangular | 90 | 90 | 252 | 3 | 5.3 | 3 |
| 254 | 18 | 54 | Rectangular | 90 | 90 | 504 | 3 | 5.8 | 3 |
| 254 | 18 | 54 | Rectangular | 90 | 90 | 756 | 3 | 5.9 | 3 |

TABLE 3

| Pixel size (μm) | Horizontal interval (μm) | Vertical interval (μm) | Structure | Angle (°) | Direction (°) | Length L (μm) | Line width (μm) | Coverage (%) | Deterioration scale |
|---|---|---|---|---|---|---|---|---|---|
| 84 | 8 | 20 | Curved | 80 | 0 | 0 | 1 | 0.0 | 5 |
| 84 | 8 | 20 | Curved | 80 | 0 | 84 | 1 | 3.3 | 5 |
| 84 | 8 | 20 | Curved | 80 | 0 | 168 | 1 | 3.3 | 5 |
| 84 | 8 | 20 | Curved | 80 | 0 | 252 | 1 | 3.3 | 4.5 |
| 84 | 8 | 20 | Curved | 80 | 90 | 0 | 1 | 0.0 | 5 |
| 84 | 8 | 20 | Curved | 80 | 90 | 84 | 1 | 6.7 | 3 |
| 84 | 8 | 20 | Curved | 80 | 90 | 168 | 1 | 6.7 | 3 |
| 84 | 8 | 20 | Curved | 80 | 90 | 252 | 1 | 6.7 | 2 |
| 84 | 8 | 20 | Curved | 80 | 0 | 0 | 3 | 0.0 | 5 |
| 84 | 8 | 20 | Curved | 80 | 0 | 84 | 3 | 6.5 | 4 |
| 84 | 8 | 20 | Curved | 80 | 0 | 168 | 3 | 6.5 | 4 |
| 84 | 8 | 20 | Curved | 80 | 0 | 252 | 3 | 6.5 | 3 |
| 84 | 8 | 20 | Curved | 80 | 90 | 0 | 3 | 0.0 | 3 |
| 84 | 8 | 20 | Curved | 80 | 90 | 84 | 3 | 18.0 | 3 |
| 84 | 8 | 20 | Curved | 80 | 90 | 168 | 3 | 18.0 | 2 |
| 84 | 8 | 20 | Curved | 80 | 90 | 252 | 3 | 18.0 | 1 |
| 84 | 8 | 20 | Rectangular | 90 | 0 | 0 | 1 | 0.0 | 5 |
| 84 | 8 | 20 | Rectangular | 90 | 0 | 84 | 1 | 3.1 | 4.5 |
| 84 | 8 | 20 | Rectangular | 90 | 0 | 168 | 1 | 3.1 | 4.5 |
| 84 | 8 | 20 | Rectangular | 90 | 0 | 252 | 1 | 3.1 | 4.5 |
| 84 | 8 | 20 | Rectangular | 90 | 90 | 0 | 1 | 0.0 | 5 |
| 84 | 8 | 20 | Rectangular | 90 | 90 | 84 | 1 | 9.1 | 3.5 |
| 84 | 8 | 20 | Rectangular | 90 | 90 | 168 | 1 | 9.1 | 2 |
| 84 | 8 | 20 | Rectangular | 90 | 90 | 252 | 1 | 9.1 | 2 |
| 84 | 8 | 20 | Rectangular | 90 | 0 | 0 | 3 | 0.0 | 5 |
| 84 | 8 | 20 | Rectangular | 90 | 0 | 84 | 3 | 6.2 | 3 |
| 84 | 8 | 20 | Rectangular | 90 | 0 | 168 | 3 | 6.2 | 3 |
| 84 | 8 | 20 | Rectangular | 90 | 0 | 252 | 3 | 6.2 | 3 |
| 84 | 8 | 20 | Rectangular | 90 | 90 | 0 | 3 | 0.0 | 2 |
| 84 | 8 | 20 | Rectangular | 90 | 90 | 84 | 3 | 18.2 | 2 |
| 84 | 8 | 20 | Rectangular | 90 | 90 | 168 | 3 | 18.2 | 2 |
| 84 | 8 | 20 | Rectangular | 90 | 90 | 252 | 3 | 18.2 | 2 |

With respect to the simulation experiment results presented in Tables 1 to 3, three-dimensional (cubic) graph obtained by plotting the length L (μm), the coverage C (%), and the deterioration scales of one line segment of the metal thin wire 14 forming the random mesh pattern 25a in three-dimensional coordinates is illustrated in FIG. 22.

In the cubic graph illustrated in FIG. 22, points of the length L (μm) and the coverage C (%) of the one line segment in which the deterioration scale is 4 or higher are set as points included in the range of the present invention.

Figure 23:
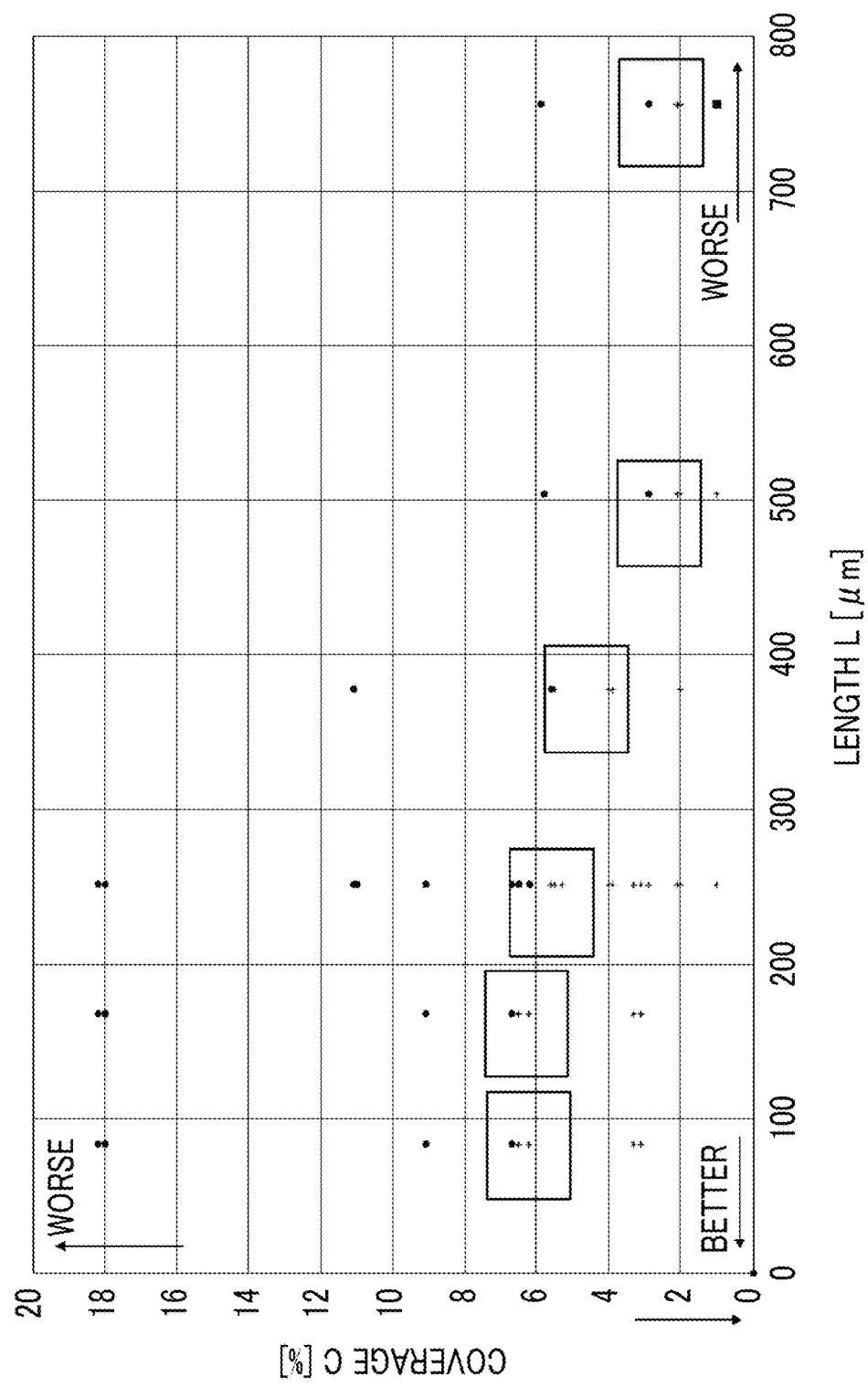
FIG. 23 is a two-dimensional graph presenting the result of the simulation experiment according to the present invention with the length L and the coverage C.

With respect to the simulation experiment results presented in Tables 1 to 3, in the xy two-dimensional coordinates in which the length L (μm) of one line segment of the metal thin wire 14 forming the random mesh pattern 25a is set as an x axis (horizontal axis), and the coverage C (%) is set as the y axis (vertical axis), a graph obtained by plotting the coverage C (%) for each of seven kinds of lengths L (μm) of 0 μm, 84 μm, 168 μm, 252 μm, 378 μm, 504 μm, and 756 μm is illustrated in FIG. 23.

In FIG. 23, in a case where the coverage C (%) is plotted for each of the lengths L (μm), points of the coverage C (%) in which the deterioration scale is 5 are illustrated with asterisks (*), and points of the coverage C (%) in which the deterioration scale is are illustrated with black dots (•).

In FIG. 23, ranges surrounded by squares indicate regions in which black dots (•) are changed to asterisks (*) in the respective lengths L.

In FIG. 23, with respect to the respective lengths L, in the regions surrounded by the squares, among the black dots (•) in which the deterioration scales are 4, points in which the coverage C (%) are the maximum are obtained as the maximum values of the coverage C (%). Points in which the deterioration scales are 4 are acceptable.

The results thereof are presented as the maximum values in Table 4.

A graph obtained by plotting six points formed of the lengths L (μm) and the maximum values of the coverage C (%) which are obtained in this manner as coordinate points a, b, c, d, e, and f in xy two-dimensional coordinates in which the length L (μm) is set as the x axis and the coverage C (%) is set as the y axis and connecting adjacent coordinate points of the coordinate points a, b, c, d, e, and f with straight line-shaped solid lines is illustrated in FIG. 19.

The polygonal line graphs of solid lines illustrated in FIG. 19 are obtained as equations presented in Table 5. The equations presented in Table 5 obtained in this manner carry out Equation (2).

The ranges of the length L (μm) and the coverage C (%) according to the present invention may be obtained from the above. According to the range of the present invention obtained in this manner, the deterioration scale is 4 or more, even in a case where the random mesh pattern of the conductive film in which the length L (μm) and the coverage C (%) are included in the range of the present invention is overlapped with the BM pattern of the display, the deterioration of the visibility of the noise is not recognized or satisfactory visibility in which the deterioration of the visibility of the noise is recognized but is not concerned is exhibited.

The specific range of the present invention is described above as the regions indicated as maximum values in Table 4, in a case where the length L (μm) and the coverage C (%) are set as the xy coordinates, and thus the descriptions thereof are omitted.

TABLE 4

| Coordinate point | Length L (μm) | Coverage (%) | | |
|---|---|---|---|---|
| | | Maximum value | Median point | Minimum value |
| a | 84 | 6.7 | 6.6 | 6.5 |
| b | 168 | 6.7 | 6.6 | 6.5 |
| c | 252 | 6.2 | 5.9 | 5.6 |
| d | 378 | 5.6 | 5.55 | 5.5 |
| e | 504 | 2.9 | 2.5 | 2.1 |
| f | 756 | 2.9 | 2.5 | 2.1 |

TABLE 5

| Region No. | Variable range | | | | Coverage y = ax + b | |
|---|---|---|---|---|---|---|
| | | | | | a | b |
| 1 | 0 | ≤ | Length | ≤ 168 | 0 | 6.7 |
| 2 | 168 | < | Length | ≤ 252 | −0.00595 | 7.7 |
| 3 | 252 | < | Length | ≤ 373 | −0.00476 | 7.4 |
| 4 | 378 | < | Length | ≤ 504 | −0.02143 | 13.7 |
| 5 | 504 | < | Length | ≤ 756 | 0 | 2.9 |

Subsequently, in FIG. 23, with respect to the respective lengths L, in the regions surrounded by the squares, median points between points in which the coverage C (%) among the black dots (•) in which the deterioration scale is 4 is maximum and points in which the coverage C (%) among the asterisks (*) in which the deterioration scale is 5 are minimum are obtained as median points of the coverage C (%).

The results thereof are presented as the median points in Table 4.

A graph obtained by plotting six points formed of the lengths L (μm) and the median points of the coverage C (%) which are obtained in this manner as coordinate points a, b, c, d, e, and f in the xy two-dimensional coordinates illustrated in FIG. 19 and connecting adjacent coordinate points of the coordinate points a, b, c, d, e, and f with straight line-shaped broken lines may be obtained.

The polygonal line graphs of broken lines (dotted lines) illustrated in FIG. 19 are obtained as the equations presented in Table 6.

In the regions (ranges) defined by the mathematical equations presented in Table 6, the deterioration scales are closer to 5 than in the polygonal line graphs of solid lines illustrated in FIG. 19, the numerical equations presented in Table 5, or the range of the present invention defined by Equation (2), and thus it is considered that the regions (ranges) are more preferable ranges to the present invention.

That is, the regions (ranges) defined by the numerical equations presented in Table 6 are ranges defined by Equation (3).

Accordingly, the random mesh pattern is preferably formed of one or more metal thin wires formed of one line segment included in the region below the line represented by Equation (3) in the xy two-dimensional coordinates.

In a case where $0 < x \leq 168$, $y = 6.6$, in a case where $168 < x \leq 252$, $y = -0.00833x + 8.0$, in a case where $252 < x \leq 378$, $y = -0.00278x + 6.6$, in a case where $378 < x \leq 504$, $y = -0.02421x + 14.7$, and in a case where $504 < x \leq 756$, $y = 2.5$ (3)

TABLE 6

| Region No. | Variable range | | | | Coverage y = ax + b | |
|---|---|---|---|---|---|---|
| | | | | | a | b |
| 1 | 0 | ≤ | Length | ≤ 168 | 0 | 6.6 |
| 2 | 168 | < | Length | ≤ 252 | −0.00833 | 8 |
| 3 | 252 | < | Length | ≤ 373 | −0.00278 | 6.6 |
| 4 | 378 | < | Length | ≤ 504 | −0.02421 | 14.7 |
| 5 | 504 | < | Length | ≤ 756 | 0 | 2.5 |

As presented as median points in Table 4, this region may be defined even on two-dimensional coordinates, as a region below a line obtained by connecting six coordinates (84, 6.6), (168, 6.6), (252, 5.9), (378, 5.55), (504, 2.5), and (756, 2.5) in the xy two-dimensional coordinates and a region in which the length L of one line segment is 84 μm or less, and the coverage C is 6.6% or less.

Figure 24:
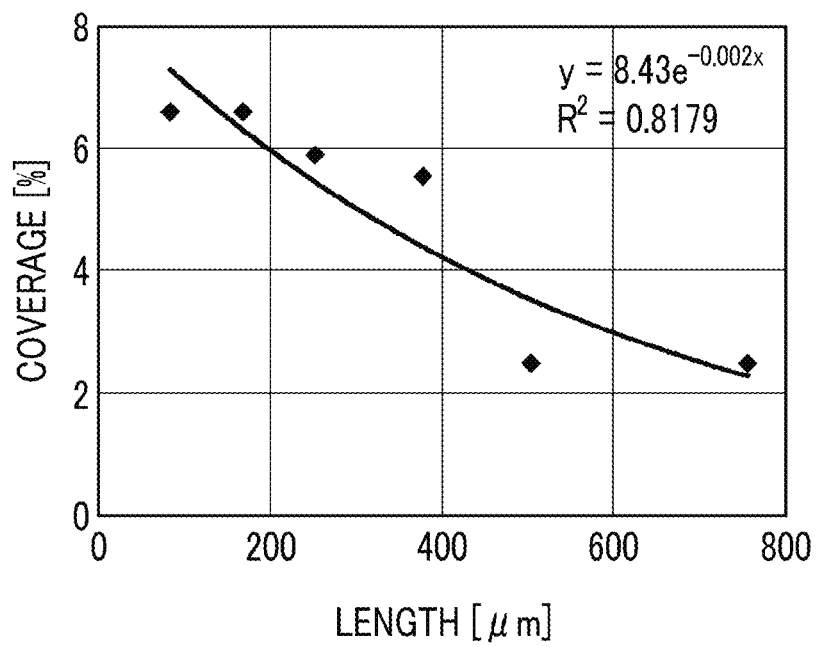
FIG. 24 is a graph presenting an approximate equation obtained from the result of the simulation experiment according to the present invention.
Figure 25:
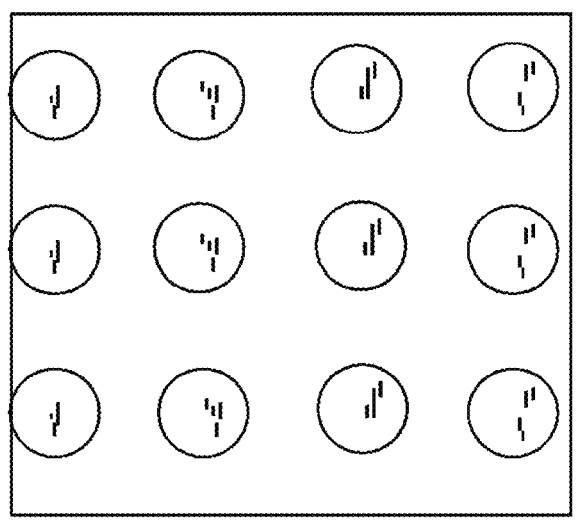
FIG. 25 is a diagram schematically illustrating a repeating shape recognized in the related art.

Instead of Equation (3) and the polygonal line graph of dotted line illustrated in FIG. 19, the region may be indicated by Approximate expression $y=8.43e^{31 \cdot 0.002x}$ by the Least squares method from the six coordinates and a curved line illustrated in FIG. 24. In this case, the coefficient of determination $R^2$ becomes 0.8179.

In FIG. 23, with respect to the respective lengths L, in the regions surrounded by the squares, among the asterisks (*) in which the deterioration scales are 5, points in which the coverage C (%) are the minimum are obtained as the minimum values of the coverage C (%).

The results thereof are presented as the minimum values in Table 4.

A graph obtained by plotting six points formed of the lengths L (μm) and the minimum values of the coverage C (%) which are obtained in this manner as coordinate points a, b, c, d, e, and f in the xy two-dimensional coordinates illustrated in FIG. 19 and connecting adjacent coordinate points of the coordinate points a, b, c, d, e, and f with alternate long and short dashed lines may be obtained.

The polygonal line graphs of alternate long and short dashed lines illustrated in FIG. 19 are obtained as mathematical equations presented in Table 7.

In the regions (ranges) defined by the mathematical equations presented in Table 7, that is, the regions (ranges) defined by the polygonal line graphs of alternate long and short dashed lines illustrated in FIG. 19, the deterioration scales are further closer to 5 and thus are higher than the polygonal line graphs of alternate long and short dashed lines illustrated in FIG. 19 or the range of the present invention defined by Equation (3), and thus it is considered that the regions (ranges) are more preferable ranges to the present invention.

That is, the regions (ranges) defined by the numerical equations presented in Table 7 are ranges defined by Equation (4).

Accordingly, the random mesh pattern is preferably formed of one or more metal thin wires formed of one line segment included in the region below the line represented by Equation (4) in the xy two-dimensional coordinates.

In a case where $0<x\leq168$, $y=6.5$, in a case where $168<x\leq252$, $y=-0.01071x+8.3$, in a case where $252<x\leq378$, $y=-0.00079x+5.8$, in a case where $378<x\leq504$, $y=-0.02698x+15.7$, and in a case where $504<x\leq756$, $y=2.1$ \hfill (4)

TABLE 7

| Region No. | Variable range | | | | | Coverage y = ax + b | |
|---|---|---|---|---|---|---|---|
| | | | | | | a | b |
| 1 | 0 | ≤ | Length | ≤ | 168 | 0 | 6.5 |
| 2 | 168 | < | Length | ≤ | 252 | −0.01071 | 8.3 |
| 3 | 252 | < | Length | ≤ | 378 | −0.00079 | 5.8 |
| 4 | 378 | < | Length | ≤ | 504 | −0.02698 | 15.7 |
| 5 | 504 | < | Length | ≤ | 756 | 0 | 2.1 |

As presented as minimum values in Table 4, this region, that is, the regions (ranges) defined by the polygonal line graphs of alternate long and short dashed lines illustrated in FIG. 19 may be defined even on two-dimensional coordinates, as a region below a line obtained by connecting six coordinates (84, 6.5), (168, 6.5), (252, 5.6), (378, 5.5), (504, 2.1), and (756, 2.1) in the xy two-dimensional coordinates and a region in which the length L of one line segment is 84 μm or less, and the coverage C is 6.5% or less.

Accordingly, the random mesh pattern is more preferably formed of one or more metal thin wires formed of one line segment included in the region defined by the coordinates in the xy two-dimensional coordinates.

In the example described above, as presented in Tables 1 to 4, as the length L (μm) of the one line segment, six kinds of representative lengths of 84 μm, 168 μm, 252 μm, 378 μm, 504 μm, and 756 μm are used, but these lengths are not particularly limited, and any lengths may be selected, but the length depends on the length of the subpixel of the BM pattern of the display in the longitudinal direction, so it is preferable that the length is caused to correspond to the length of the subpixel in the longitudinal direction. In the examples described above, as the representative length of the length L (μm) of one line segment, six kinds of representative lengths are used, but the present invention is not particularly limited, and any kinds thereof may be used. In a case where the number of representative lengths is great, the correctness increases, but it takes much time to be complicated, and thus the number of representative lengths is suitably selected according to the accuracy and the use thereof.

The range of the length L (μm) of the one line segment is not particularly limited, and any ranges of the length may be selected, but as illustrated in FIG. 19, according to the present invention, it is preferable that the region for determining the range of the present invention is a region in which the length L of the one line segment is greater than 0 μm and 756 μm or less. Here, in a case where the length L of the one line segment is less than 84 μm, the visibility as the noise is originally low, and thus in order to effectively determine the visibility of the noise, it is more preferable that the region for determining the range of the present invention is a region in which the length L of the one line segment is 84 μm to 756 μm.

The random mesh pattern is formed of the unit random mesh pattern repeating in one direction and a direction perpendicular to the one direction, and the one line segment is preferably a repeating shape repeating for each unit random mesh pattern.

The repeating shape is preferably a linear shape that periodically repeats by the repetition of the unit random mesh pattern data.

In the above, the conductive film according to the present invention, the display device including the same, and the evaluation method of the pattern of the conductive film are described with respect to various embodiments and examples, but the present invention is not limited thereto, and it is obvious that various modifications and changes in design may be performed.

EXPLANATION OF REFERENCES 10, 11, 11A, 11B: conductive film
12: transparent base body
14: metal thin wire (metal thin wire)
16, 16a, 16b: wiring portion
18, 18a, 18b: adhesive layer 20, 20a, 20b: protective layer
21: mesh wiring
22: opening portion
23a: electrode portion
23b: dummy electrode portion (non-electrode portion)
24: wiring pattern (composite wiring pattern, single layer wiring pattern)
24a: first (upper) wiring pattern
24b: second (lower) wiring pattern
25a, 25b, 25c, 25d, 25e: random mesh pattern
26: dummy electrode portion
27: regular fixed pattern
28, 28a, 28b: wiring layer
30: display unit
32, 32r, 32g, 32b: pixel
34: black matrix (BM)
38: BM pattern
40: display device
44: touch panel

What is claimed is:

1. A conductive film provided on a display unit of a display device, comprising:
    a transparent base body; and
    a conductive portion formed of a plurality of metal thin wires and provided on at least one surface of the transparent base body,
    wherein the conductive portion has an irregular wiring pattern which has a mesh shape formed of the plurality of metal thin wires and has a plurality of opening portions having different opening shapes,
    wherein the display unit has a pixel arrangement pattern in which pixels including a plurality of subpixels that emit light in a plurality of colors of at least three colors are arranged,
    wherein the conductive film is provided on the display unit such that the irregular wiring pattern and the pixel arrangement pattern of the display unit are overlapped with each other,
    wherein, in a case where one or more of the metal thin wires forming the irregular wiring pattern is formed of one continuous line segment which extends in the longitudinal direction of the subpixels of the display unit and which can be regarded as one and the one line segment traverses one or more subpixels that are arranged in the longitudinal direction in the longitudinal direction, in a case where a total length of one or more traverse subpixels in which the one line segment is traversed in the longitudinal direction is set as a length L μm of the one line segment, a total area of one or more traverse subpixels is set as S, and a total area occupied by the one line segment in the one or more traverse subpixels is set as a line width area $S_L$, and a coverage C % is represented by Equation (1), $$C = 100 \times S_L/S \quad (1),$$

in an xy two-dimensional coordinates in which the length L of the one line segment is set as a lateral axis which is an x coordinate and a coverage C is a vertical axis which is a y coordinate, the irregular wiring pattern is formed of the one or more metal thin wires that is formed of the one line segment included in a region below a line represented by Equation (2), in a case where $0 < x \leq 168$, $y=6.7$, in a case where $168 < x \leq 252$, $y=-0.00595x+7.7$, in a case where $252 < x \leq 378$, $y=-0.00476x+7.4$, in a case where $378 < x \leq 504$, $y=-0.02143x+13.7$, and in a case where $504 < x \leq 756$, $y=2.9$ \quad (2).

2. The conductive film according to claim 1, wherein the irregular wiring pattern is formed of the one or more metal thin wires formed of the one line segment included in a region below a line represented by Equation (3) in the xy two-dimensional coordinates, in a case where $0 < x \leq 168$, $y=6.6$, in a case where $168 < x \leq 252$, $y=-0.00833x+8.0$, in a case where $252 < x \leq 378$, $y=-0.00278x+6.6$, in a case where $378 < x \leq 504$, $y=-0.02421x+14.7$, and in a case where $504 < x \leq 756$, $y=2.5$ \quad (3).

3. The conductive film according to claim 1, wherein the irregular wiring pattern is formed of the one or more metal thin wires formed of the one line segment included in a region below a line represented by Equation (4) in the xy two-dimensional coordinates, in a case where $0 < x \leq 168$, $y=6.5$, in a case where $168 < x \leq 252$, $y=-0.01071x+8.3$, in a case where $252 < x \leq 378$, $y=-0.00079x+5.8$, in a case where $378 < x \leq 504$, $y=-0.02698x+15.7$, and in a case where $504 < x \leq 756$, $y=2.1$ \quad (4).

4. The conductive film according to any one of claim 1, wherein the region is a region in which a length L of the one line segment is more than 0 μm and 756 μm or less.

5. The conductive film according to claim 1, wherein the irregular wiring pattern is formed of a unit irregular wiring pattern which includes a unit repeating in one direction and in a direction perpendicular to the one direction, and
    wherein the one line segment is a repeating shape repeating for each unit irregular wiring pattern.

6. The conductive film according to claim 5, wherein the repeating shape is a periodically repeating linear shape.

7. The conductive film according to claim 1, wherein a shape of the opening portion is two or more different kinds of opening shapes and is a polygonal shape in which the number of vertices is two or more.

8. The conductive film according to claim 1, wherein the opening portion is formed of a Voronoi polygon or a Delaunay triangle based on seed points randomly arranged in one plane region.

9. The conductive film according to claim 1, wherein an image of the pixel arrangement pattern of respective colors displayed on a display screen of the display unit is displayed on the display unit in a case where the subpixels are lit by light of a plurality of colors independently for each color.

10. The conductive film according to claim 1, wherein the plurality of colors are three colors of red, green, and blue.

11. The conductive film according to claim 1, wherein the conductive portion is provided on one surface of the transparent base body.

12. The conductive film according to claim 1, wherein the conductive portion is formed of two wiring portions, and the two wiring portions are respectively provided on both surfaces of the transparent base body.

13. The conductive film according to claim 12, wherein all of the plurality of metal thin wires of the two wiring portions form the irregular wiring pattern.

14. The conductive film according to claim 12, wherein the plurality of metal thin wires of the one wiring portion of the two wiring portions form the irregular wiring pattern, and
wherein the plurality of metal thin wires of the other wiring portion form a wiring pattern in a regular polygonal shape.

15. The conductive film according to claim 12, wherein the plurality of metal thin wires of the one wiring portion of the two wiring portions form the irregular wiring pattern, and
wherein the other wiring portion is formed of indium tin oxide.

16. The conductive film according to claim 12, wherein at least one wiring portion of the two wiring portions include an electrode portion and a non-electrode portion,
wherein the plurality of metal thin wires of one of the electrode portion and the non-electrode portion form the irregular wiring pattern, and
wherein the plurality of metal thin wires of the other of the electrode portion and the non-electrode portion form a wiring pattern in a regular polygonal shape.

17. The conductive film according to claim 1, further comprising:
a second transparent base body different from a first transparent base body, in a case where the transparent base body is set as the first transparent base body,
wherein the conductive portion is formed of two wiring portions, and
wherein one wiring portion of the two wiring portions is provided on one surface of the first transparent base body, and
wherein the other wiring portion of the two wiring portions is provided on the other surface of the first transparent base body which is one surface of the second transparent base body.

18. The conductive film according to claim 1, wherein the conductive portion is formed of two wiring portions,
wherein the two wiring portions are provided on one surface of the transparent base body with an insulating layer interposed therebetween.

19. The conductive film according to claim 1, wherein the pixel arrangement pattern is a black matrix pattern.

20. A display device comprising:
a display unit in which a pixel including a plurality of subpixels that emit light in a plurality of colors different from each other is arranged in a pixel arrangement pattern in a manner of repeating in one direction and a direction perpendicular to the one direction; and
the conductive film according to claim 1 provided on the display unit.

* * * * *